(12) United States Patent
Choi et al.

(10) Patent No.: US 12,150,342 B2
(45) Date of Patent: Nov. 19, 2024

(54) DISPLAY DEVICE AND METHOD OF PROVIDING THE SAME

(71) Applicant: Samsung Display Co., LTD., Yongin-si (KR)

(72) Inventors: Dae Won Choi, Cheonan-si (KR); Dong Won Kim, Seoul (KR); Sang Gab Kim, Seoul (KR); Sang Woo Kim, Seoul (KR); Gyu Jeong Lee, Anyang-si (KR); Sung Won Cho, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 233 days.

(21) Appl. No.: 17/467,493

(22) Filed: Sep. 7, 2021

(65) Prior Publication Data
US 2022/0165805 A1 May 26, 2022

(30) Foreign Application Priority Data
Nov. 24, 2020 (KR) .................. 10-2020-0158575

(51) Int. Cl.
*H10K 59/121* (2023.01)
*H10K 50/844* (2023.01)
*H10K 59/12* (2023.01)
*H10K 59/122* (2023.01)
*H10K 71/00* (2023.01)

(52) U.S. Cl.
CPC ......... *H10K 59/121* (2023.02); *H10K 50/844* (2023.02); *H10K 59/122* (2023.02); *H10K 71/00* (2023.02); *H10K 59/1201* (2023.02)

(58) Field of Classification Search
CPC ............... H10K 59/121; H10K 59/122; H10K 59/1201; H10K 71/00; H10K 50/844
See application file for complete search history.

(56) References Cited

U.S. PATENT DOCUMENTS

| | | | |
|---|---|---|---|
| 2020/0176696 A1* | 6/2020 | Dai | H10K 59/131 |
| 2022/0045300 A1* | 2/2022 | He | H10K 59/1213 |
| 2022/0102462 A1* | 3/2022 | Zhou | H10K 71/00 |
| 2022/0165822 A1* | 5/2022 | Jia | H10K 59/124 |
| 2023/0026482 A1* | 1/2023 | Wang | G06F 1/1652 |

FOREIGN PATENT DOCUMENTS

| | | |
|---|---|---|
| CN | 111276496 A | 6/2020 |
| KR | 1020170059537 A | 5/2017 |
| KR | 1020190027986 A | 3/2019 |
| KR | 102021029 A | 9/2019 |

OTHER PUBLICATIONS

European Search Report for European Patent Application No. 20210054.9 dated Aug. 4, 2022.

* cited by examiner

*Primary Examiner* — Shaun M Campbell
(74) *Attorney, Agent, or Firm* — CANTOR COLBURN LLP

(57) ABSTRACT

A display device includes a display panel including a main portion, a first bent portion and a second bent portion each extending from the main portion, and a corner portion which connects the first bent portion and the second bent portion to each other and is bendable relative to the main portion. The corner portion which is bendable includes a plurality of protrusion patterns partially disconnected from each other and each bendable relative to the main portion, and each of the plurality of protrusion patterns including a display pixel.

20 Claims, 17 Drawing Sheets

DA: FS, SS, CS

LEL2 : 171",172",173"

DISPLAY DEVICE AND METHOD OF PROVIDING THE SAME

This application claims priority to Korean Patent Application No. 10-2020-0158575 filed on Nov. 24, 2020, and all the benefits accruing therefrom under 35 U.S.C. 119, the contents of which in its entirety are herein incorporated by reference.

BACKGROUND

1. Field

The invention relates to a display device and a method of providing the same.

2. Description of the Related Art

With the development of information society, requirements for display devices for displaying images have increased in various forms. For example, display devices are applied to various electronic appliances such as smart phones, digital cameras, notebook computers, navigators, and smart televisions.

Examples of display devices include light receiving display devices such as a liquid crystal display device and a field emission display device, and light emitting display devices such as an organic light emitting display device including an organic light emitting element, an inorganic light emitting display device including an inorganic light emitting element such as an inorganic semiconductor, and a micro light emitting display device including a micro light emitting element.

As display devices are applied to various electronic devices, display devices having various designs are required. For example, a display device may display an image not only on a front portion but also on bent portions respectively at four edges of the front portion and on corner portions respectively between the bending portions.

SUMMARY

One or more embodiments of the invention are to provide a display device in which reliability of pixels arranged at corner portions is improved, and a method of providing the display device.

However, embodiments of the invention are not restricted to the one set forth herein. The above and other feature of the invention will become more apparent to one of ordinary skill in the art to which the invention pertains by referencing the detailed description of the invention given below.

An embodiment of a display device includes a front portion, a first side portion extending from a first side of the front portion, a second side portion extending from a second side of the front portion, and a corner portion between the first side portion and the second side portion. The display device includes a display panel including a plurality of protrusion patterns in the corner portion, the plurality of protrusion patterns are partially separated from each other in a plan view, and each of the protrusion patterns includes a plurality of pixels and a recess pattern surround the plurality of pixels therein.

An embodiment of a display device includes a display panel including a main portion, a bending portion extending from a side surface of the main portion, and a plurality of protrusion patterns protruding from at least one of the main portion and the bending portion and at least partially separated from each other. Each of the protrusion patterns includes a substrate, a conductive line on the substrate, an etch prevention pattern on the conductive line, a planarization layer on the etch prevention pattern, a barrier layer on the planarization layer, a pixel electrode on the barrier layer, a pixel defining layer on the pixel electrode and exposing the pixel electrode, a light emitting layer on the pixel electrode exposed by the pixel defining layer, and a recess pattern surrounding the light emitting layer and defined by removing at least a part of the planarization layer.

An embodiment of a method of providing a display device, the method includes providing a conductive line, an etch prevention pattern on the conductive line, an organic layer on the etch prevention pattern, and an inorganic layer on the organic layer on a substrate, etching the inorganic layer in a second area not overlapping a first area in which the conductive line and the etch prevention pattern are disposed, and etching the inorganic layer and the organic layer in the first area to provide a recess pattern, and etching the inorganic layer, the organic layer, and the substrate in the second area to provide a cutout portion. The recess pattern and the cutout portion are provided by the same process.

According to one or more embodiment of a display device and a method of manufacturing the display device, reliability of display pixels arranged at corner portions of the display device may be improved.

The effects of the invention are not limited by the foregoing, and other various effects are anticipated herein.

BRIEF DESCRIPTION OF THE DRAWINGS

The above and other features of the invention will become more apparent by describing in detail embodiments thereof with reference to the attached drawings, in which.

DETAILED DESCRIPTION

Figure 1:
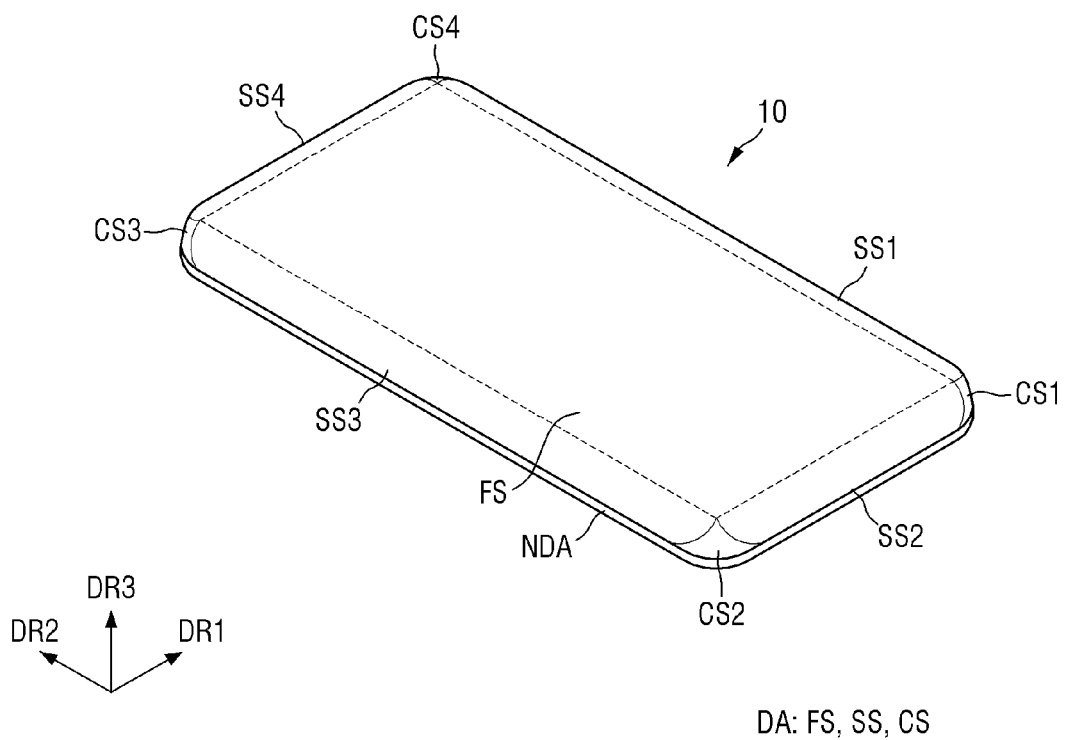
FIG. 1 is a perspective view of an embodiment of a display device.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will also be understood that when a layer is referred to as being related to another element such as being "on" another layer or substrate, it can be directly on the other layer or substrate, or intervening layers may also be present. In contrast, when a layer is referred to as being related to another element such as being "directly on" another layer or substrate, no intervening layer is present.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments.

The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the attached drawings.

Figure 2:
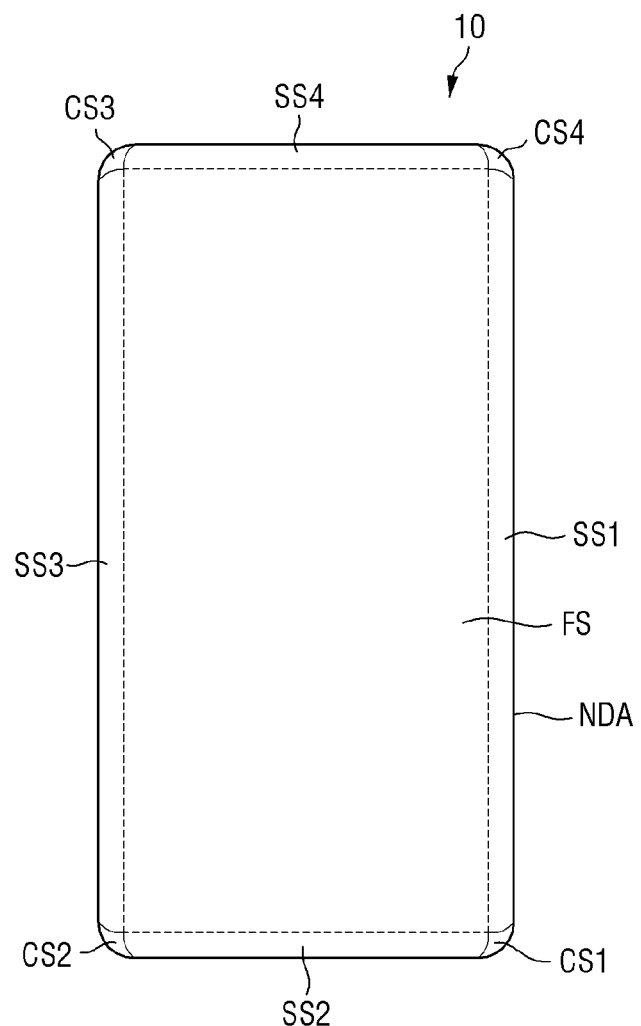
FIG. 2 is a plan view of the display device of FIG. 1.
Figure 2:
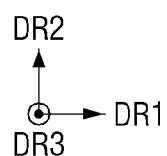

FIG. 1 is a perspective view of an embodiment of a display device 10. FIG. 2 is a plan view of the display device 10 of FIG. 1.

Referring to FIGS. 1 and 2, a display device 10 includes a display screen at which an image is displayed. The image is displayed at a display area DA and may be included in various devices. In embodiments, for example, the display device 10 may be applied to mobile phones such as smart phones, tablet personal computers (tablet PCs), personal digital assistants (PDAs), portable multimedia players (PMPs), game machines, watch-type electronic appliances, head mount displays, monitors of personal computers, notebook computers, automobile navigators, automobile instrument panels, digital cameras, camcorders, external billboards, sign boards, medical devices, inspection devices, various home appliances such as refrigerators and washing machines, and internet of things (IOTs).

Referring to FIG. 2, in a plan view, short sides of the display device 10 may extend along a direction parallel to the first direction DR1, and long sides of the display device 10 may extend along a direction parallel to the second direction DR2. The first direction DR1 and the second direction DR2 intersect each other. In an embodiment, the first direction DR1 and the second direction DR2 are perpendicular to each other. The first direction DR1 may be a horizontal direction of the display device 10 in a plan view, and the second direction DR2 may be a vertical direction of the display device 10 in a plan view. The third direction DR3 is a direction crossing both of the first direction DR1 and the second direction DR2, such as being perpendicular thereto. The third direction DR3 may be a thickness direction of the display device 10 and various components or layers thereof.

The display device 10 may include a display area DA and a non-display area NDA. Various components and layers of the display device 10 may include a display area DA and a non-display area NDA corresponding to those described for the display device 10.

The display area DA may display an image. The display area DA may include display pixels and/or light emission areas EA1, EA2, EA3, and EA4 at which an image is generated, an image is displayed, light is generated, light is emitted, etc. The display area DA may include a front portion FS, side portions SS (SS1, SS2, SS3, and SS4), and corner portions CS (CS1, CS2, CS3, and CS4). The side portions SS (SS1, SS2, SS3, and SS4) and corner portions CS (CS1, CS2, CS3, and CS4) may together define a bent side portion of the display device 10.

An entirety of the planar area of the front portion FS may be substantially flat, such as being in a plane defined by the first direction DR1 and the second direction DR2 crossing each other, but is not limited thereto. In an embodiment, the front portion FS may include a convex or concave shape along a thickness direction (third direction DR3) in at least a part thereof. The front portion FS may have a rectangular shape having short sides along the first direction DR1 and long sides along the second direction DR2. The front portion FS may have a round shape to define a rounded corner in a plan view. The front portion FS may have a round polygonal shape having a rounded corner in a plan view. In an embodiment, for example, as shown in FIG. 1, the front portion FS may have a rectangular shape including a rounded corner at which two sides of the front portion FS meet each other, but the invention is not limited thereto.

The side portions SS (SS1, SS2, SS3, and SS4) may extend outward from edges of the front portion FS to be bent at an angle from the front portion FS. In an embodiment, for example, the side portions SS may be bent at an angle of about 90° or more and less than about 180° with respect to the front portion FS. When the front portion FS has a rectangular shape in a plan view, the side portions SS may include a first side portion SS1 and a third side portion SS3 respectively extending from the front portion FS along the first direction DR1 in opposing directions, and may include a second side portion SS2 and a fourth side portion SS4 respectively extending from the front portion FS along the second direction DR2 in opposing directions. The first to fourth side portions SS1, SS2, SS3, and SS4 may have substantially the same function or configuration except for positions relative to the front portion FS.

A profile of each of the side portions SS (SS1, SS2, SS3, and SS4) may have a rounded shape or bent shape in a plan view, but the invention is not limited thereto.

Each of the first to fourth side portions SS1, SS2, SS3, and SS4 may extend from the front portion FS to have a rounded shape including a curvature. Each of the first to fourth side portions SS1, SS2, SS3, and SS4 may have a shape that is convex in a direction toward the outside the display device 10 (e.g., direction away from the front portion FS). In an embodiment, for example, the first side portion SS1 may have a first curvature, and the second side portion SS2 may have a second curvature. The third side portion SS3 may have a third curvature, and the fourth side portion SS4 may have a fourth curvature. The first to fourth curvatures may be the same as each other, but are not limited thereto. In embodiments, the first to fourth curvatures may be different from each other, or only some among the first to fourth curvatures may be the same as each other.

Each of the corner portions CS (CS1, CS2, CS3, and CS4) may be respectively disposed between side portions SS (SS1, SS2, SS3, and SS4) which are adjacent to each other. The corner portions CS (CS1, CS2, CS3, and CS4) may connect adjacent side portions to each other at corners of the display device 10. In other words, the first to fourth side portions SS1, SS2, SS3, and SS4 may be spaced apart from each other in at least some areas by an interval. The corner portions CS (CS1, CS2, CS3, and CS4) may be disposed in areas where the first to fourth side portions SS1, SS2, SS3, and SS4 are spaced apart from each other along a periphery of the display device 10. A side surface of the display device 10 may include the side portions SS (SS1, SS2, SS3, and SS4) together with the corner portions CS (CS1, CS2, CS3, and CS4).

In an embodiment, for example, the first corner portion CS1 may be disposed between the first side portion SS1 and the second side portion SS2, the second corner portion CS2 may be disposed between the second side portion SS2 and the third side portion SS3, the third corner portion CS3 may be disposed between the third side portion SS3 and the fourth side portion SS4, and the fourth corner portion CS4 may be disposed between the fourth side portion SS4 and the first side portion SS1. The first to fourth corner portions CS1, CS2, CS3, and CS4 may have substantially the same function or configuration except for positions around the periphery of the display device 10.

The display device 10 at each of the first to fourth corner portions CS1, CS2, CS3, and CS4 may have a round shape having a double curvature. In an embodiment, for example, the first corner portion CS1 may be disposed between the first side portion SS1 and the second side portion SS2. In this case, a side surface of the display device 10 at the first corner portion CS1 may have a double curvature including both a first curvature of the first side portion SS1 and a second curvature of the second side portion SS2. The above description of the first corner portion CS1 may also be applied to the second to fourth corner portions CS2, CS3, and CS4.

A display pixel provided in plural including a display pixels may be arranged within the corner portions CS as well as the front portion FS and the side portions SS of the display device 10. A display screen of the display device 10 may be defined by the corner portions CS together with the front portion FS and the side portions SS. Accordingly, from a front of the display device 10, a displayed image may be recognized at an entirety of the display device 10. In other words, recognition of a bezel area may be minimal to provide a more immersive display screen.

The non-display area NDA may not display an image. The non-display area NDA may not include (e.g., may exclude) display pixels or light emission areas EA1, EA2, EA3, and EA4. The non-display area NDA may be provided with signal lines connected to the display pixels or the light emission areas EA1, EA2, EA3, and EA4 for driving the display pixels or light emission areas EA1, EA2, EA3, and EA4 and/or may be provided with a scan driver. The non-display area NDA may be disposed adjacent to the display area DA. In an embodiment, the non-display area NDA may surround the display area DA. The non-display area NDA may be disposed outside each of the front portion FS, the side portions SS and the corner portions CS to be excluded from each of the front portion FS, the side portions SS and the corner portions CS. The non-display area NDA may form a bezel area of the display device 10. The side portions SS (SS1, SS2, SS3, and SS4) and the corner portions CS (CS1, CS2, CS3, and CS4) may be between the front portion FS and the non-display area NDA.

Figure 3:
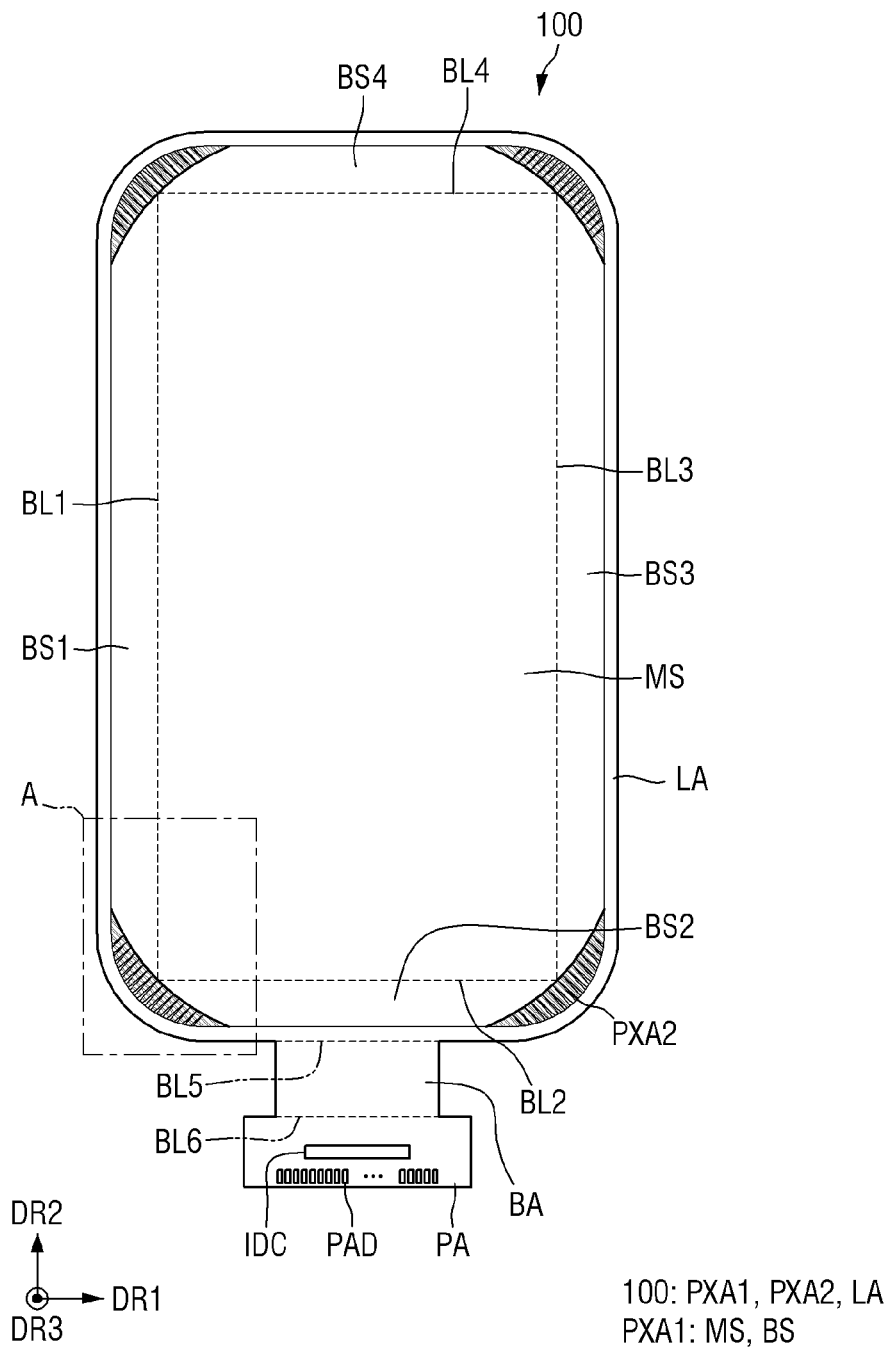
FIG. 3 is a plan view of an embodiment of a display panel of a display device.
Figure 4:
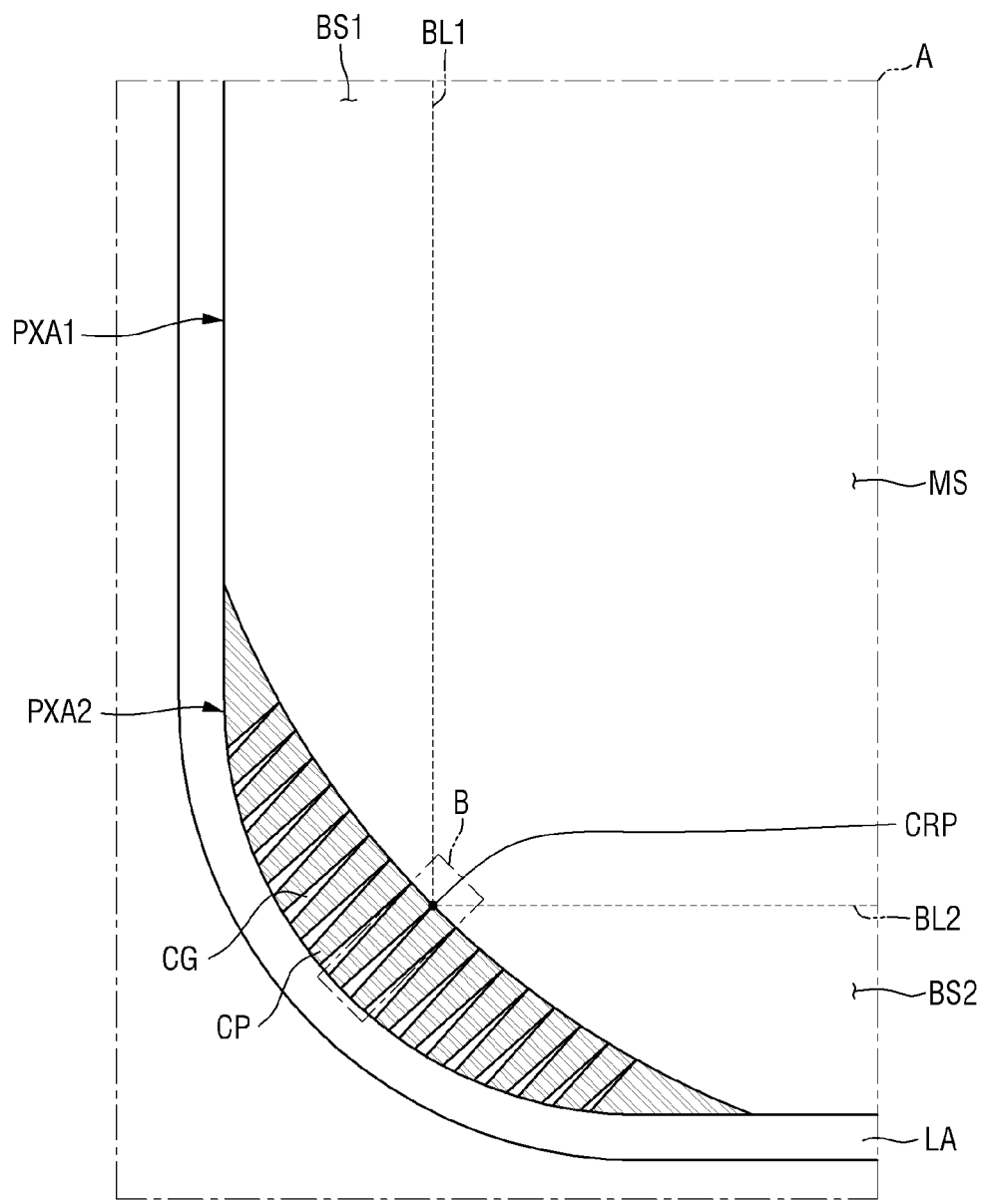
FIG. 4 is an enlarged view of an embodiment of area A of FIG. 3.
Figure 4:
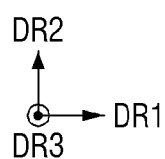
Figure 5:
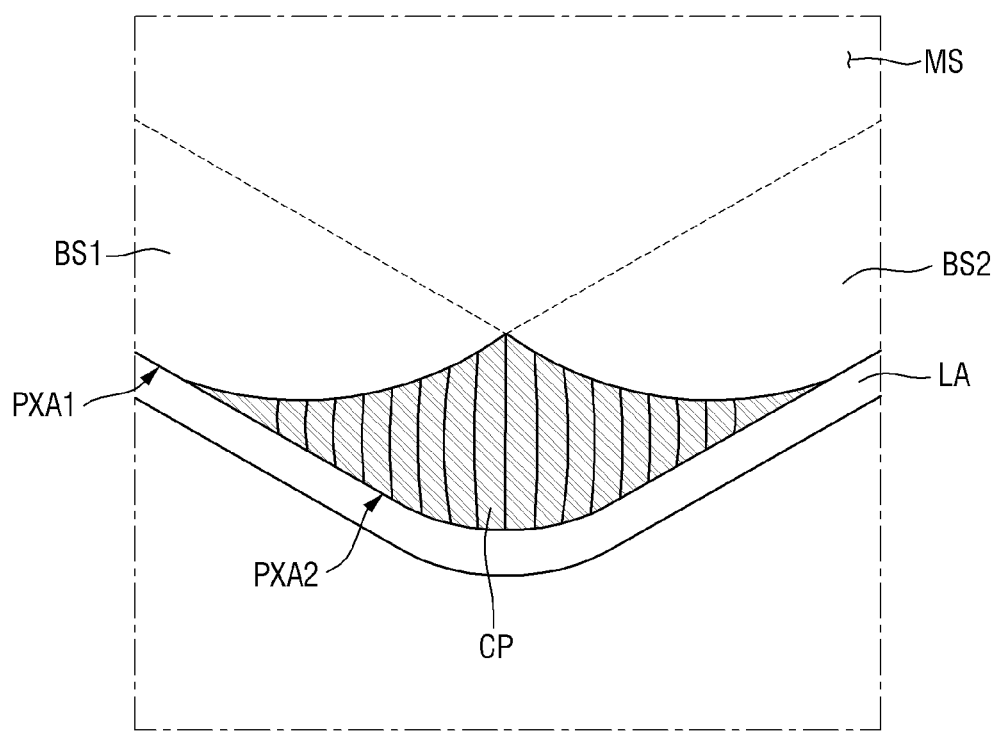
FIG. 5 is a partial perspective view illustrating an embodiment of a display panel of a display device.
Figure 5:
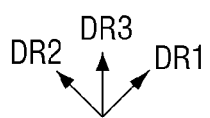

FIG. 3 is a plan view of a display panel 100 of a display device 10. FIG. 4 is an enlarged view of area A of FIG. 3. FIG. 5 is a partial perspective view illustrating an embodiment of a display panel 100 of a display device 10. FIG. 5 shows an enlarged view of a bent portion of area A of FIG. 3.

Referring to FIGS. 3, 4 and 5, the display device 10 may include a display panel 100. The display panel 100 may be a flexible display panel. In other words, the display panel 100 may be bendable, foldable and/or rollable.

The display panel 100 may be a light emitting display panel including a light emitting element. In an embodiment, for example, the display panel 100 may be at least one of an organic light emitting display panel using an organic light emitting diode as a light emitting element, a micro light-emitting diode ("LED") display panel using a micro LED as a light emitting element, a quantum dot organic light emitting display panel using a quantum dot and an organic light emitting diode, and an inorganic light emitting display panel using an inorganic semiconductor as a light emitting element. Hereinafter, there is exemplified a case where the display panel 100 is an organic light emitting display panel.

The display panel 100 may include a first pixel area PXA1, a second pixel area PXA2, and a line area LA. Each of the first pixel area PXA1 and the second pixel area PXA2 may include a plurality of display pixels, and the line area LA may exclude pixels but include signal lines which are connected to the display pixels for driving or controlling the display pixels to emit light, display an image, etc. The first pixel area PXA1 and the second pixel area PXA2 may correspond to the display area DA (refer to FIG. 1) of the display device 10 (refer to FIG. 1), and the line area LA may correspond to the non-display area NDA (refer to FIG. 1) of the display device 10 (refer to FIG. 1). The line area LA may be disposed adjacent to and outside the first pixel area PXA1 and the second pixel area PXA2. In an embodiment, the line area LA may surround the first pixel area PXA1 and the second pixel area PXA2 in the plan view.

The first pixel area PXA1 may include a main portion MS of the display panel 100 and bending portions BS (BS1, BS2, BS3, and BS4) as bent portions of the display panel 100. The main portion MS may correspond to the front portion FS (refer to FIG. 1) of the display device 10 (refer to FIG. 1), and the bending portions BS (BS1, BS2, BS3, and BS4) may correspond to the side portions SS (SS1, SS2, SS3, and SS4) (refer to FIG. 1) of the display device 10 (refer to FIG. 1). The planar shape of the main portion MS may substantially correspond to the planar shape of the front portion FS (refer to FIG. 1) of the display device 10 (refer to FIG. 1), and the shape or profile of each of the bending portions bending portions BS (BS1, BS2, BS3, and BS4) may substantially correspond to the shape or profile of the side portions SS (SS1, SS2, SS3, and SS4) (refer to FIG. 1) of the display device 10 (refer to FIG. 1).

The bending portions BS (BS1, BS2, BS3, and BS4) may extend outward from edges of the main portion MS to be bent at an angle. The first to fourth bending portions BS1, BS2, BS3, and BS4 may extend from the main portion MS, and may be bent along bending lines BL1, BL2, BL3, and BL4, respectively. The bending lines BL1, BL2, BL3, and BL4 may correspond to edges of the front portion FS of the display device 10. In an embodiment, for example, the bending portion BS may be bent at an angle of about 90° or more and less than about 180° with respect to the main portion MS.

The display panel 100 may include an intersection point CRP at which adjacent bending lines meet or at which a respective bending line meets a boundary between the first pixel area PXA1 and the second pixel area PXA2 at a respective corner portion of the display device 10. The intersection point CRP of each of the bending lines BL1, BL2, BL3, and BL4 may be located between the first pixel area PXA1 and the second pixel area PXA2, or may be located on a boundary at which the first pixel area PXA1 and the second pixel area PXA2 meet each other. However, the invention is not limited thereto, and the intersection point CRP thereof may be located within the first pixel area PXA1 or within the second pixel area PXA2.

When the main portion MS has a rectangular shape in a plan view, the bending portions BS may include a first bending portion BS1 (e.g., first bent portion) and a third bending portion BS3 (e.g., third bent portion) extending from the main portion MS along the first direction DR1 in opposite directions, and may include a second bending portion BS2 (e.g., second bent portion) and a fourth bending portion BS4 (e.g., fourth bent portion) extending from the main portion MS along the second direction DR2 in opposite directions. The first to fourth bending portions BS1, BS2, BS3, and BS4 may have substantially the same function or configuration except for positions within the display panel 100.

Each of the first to fourth bending portions BS1, BS2, BS3, and BS4 may extend from the main portion MS to have a rounded shape or bent shape including a curvature. In an embodiment, for example, the first bending portion BS1 may have a curvature that is convex along the first direction DR1 and along the third direction DR3. The curvature of the first bending portion BS1 may be substantially the same as the first curvature of the first side portion SS1 of the display device 10 (refer to FIG. 1), but the invention is not limited thereto. The first to fourth bending portions BS1, BS2, BS3, and BS4 may have the same curvature as each other, but the invention is not limited thereto. In embodiments, the first to fourth bending portions BS1, BS2, BS3, and BS4 may have different curvatures from each other.

In a plan, each of the first to fourth bending portions BS1, BS2, BS3, and BS4 may have a substantially trapezoidal shape, and in this case, opposing sides of the trapezoidal shape may have a rounded shape. In an embodiment, for example, in the first bending portion BS1, in a plan view, a length of one side extending along the second direction DR2 may be smaller than a length of the other side extending along the second direction DR2. Side surface of the first bending portion BS1 connect the one side and the other side to each other. The side surfaces of the first bending portion BS1, are located at opposing sides along the second direction DR2 in the plan view and may have a rounded shape. However, the shape of the first bending portion BS1 is not limited thereto. The above description of the first bending portion BS1 may also be applied to the second to fourth bending portions BS2, BS3, and BS4.

The second pixel area PXA2 may be disposed between the bending portions BS (BS1, BS2, BS3, and BS4) adjacent to each other. The second pixel area PXA2 may correspond to the corner portions CS (refer to FIG. 1) of the display device 10 (refer to FIG. 1). In other words, the first to fourth bending portions BS1, BS2, BS3, and BS4 may be spaced apart from each other in at least some areas by an interval. The second pixel area PXA2 may connect adjacent ones of the bending portions BS (BS1, BS2, BS3, and BS4) to each other along the edges of the main portion MS. The second pixel area PXA2 may be disposed in areas where the first to fourth bending portions BS1, BS2, BS3, and BS4 are spaced apart from each other.

In an embodiment, for example, the second pixel area PXA2 may be disposed between the first bending portion BS1 and the second bending portion BS2 in a direction along the edge of the main portion MS, between the second bending portion BS2 and the third bending portion BS3 in the direction along the edge of the main portion MS, between the third bending portion BS3 and the fourth bending portion BS4 in the direction along the edge of the main portion MS, and/or between the fourth bending portion BS4 and the first bending portion BS1 in the direction along the edge of the main portion MS.

The display panel 100 at the second pixel area PXA2 may have a rounded shape of a double curvature. In an embodiment, for example, the side surface of the display panel 100 the second pixel area PXA2 disposed between the first bending portion BS1 and the second bending portion BS2 may have a double curvature including a curvature of the first bending portion BS1 and a curvature of the second bending portion BS2. The second pixel area PXA2 together with the bending portions BS (BS1, BS2, BS3, and BS4) may define a bent side portion of the display panel 100.

The second pixel area PXA2 may include a protrusion pattern CP provided in plural including a plurality of protrusion patterns CP. The protrusion patterns CP which are adjacent to each other may be physically separated from each other (e.g., spaced apart from each other) in at least some areas (e.g., partially disconnected from each other). Although will be described later, within the display panel 100 the protrusion patterns CP may be physically separated at the uppermost layer to the lowermost layer of the substrate (refer to "SUB" in FIG. 8) in at least some areas to be open at both the uppermost layer and the lowermost layer. Each of the plurality of protrusion patterns CP includes an inner sidewall defining the recess (e.g., recess pattern RC), and an outer sidewall defining an outer side surface of each of the plurality of protrusion patterns CP.

A cutout portion CG may be provided in plural including a plurality of cutout portions CG (or cutout patterns) which are defined where the protrusion patterns CP adjacent to each other are physically separated. That is, a space may be provided between the protrusion patterns CP adjacent to each other by the cutout portion CG. Thus, even when the second pixel area PXA2 has a double curvature, the protrusion patterns CP of the second pixel area PXA2 can be stretched and contracted in bending, folding and/or rolling of the display panel 100, so that strain applied to the second pixel area PXA2 by the cutout portions CG may be reduced. The protrusion patterns CP may be provided or formed by cutting the substrate SUB of the display panel 100 (refer to "SUB" in FIG. 8) with a laser, but the invention is not limited thereto.

The protrusion pattern CP may protrude from the first pixel area PXA1. In other words, the protrusion pattern CP may protrude toward away from the first pixel area PXA1 from at least one of the main portion MS and the bending portion BS of the first pixel area PXA1. The protrusion pattern CP may protrude from the first pixel area PXA1 toward the line area LA. The main portion MS and/or the bending portion BS may extend into the second pixel area PXA2 to define extended portions of the main portion MS or the bending portion BS which are in the second pixel area PXA2. The extended portions may be partially disconnected from each other, such as at a distal end thereof, to define the protrusion patterns CP which are physically separated from each other (e.g., spaced apart from each other) in at least some areas (e.g., partially disconnected from each other).

One end (e.g., a first end) of each protrusion pattern CP may be connected to or meet the first pixel area PXA1. The other end (e.g., a second end opposite to the first end) of each protrusion pattern CP may be connected to or meet the line area LA. In other words, in a part of the display panel 100, the first pixel area PXA1 and the line area LA may be spaced apart from each other with the second pixel area PXA2 interposed therebetween. The protrusion pattern CP of the second pixel area PXA2 may be disposed in a space at which the first pixel area PXA1 and the line area LA are spaced apart from each other, and the protrusion pattern CP may connect the first pixel area PXA1 and the line area LA to each other. However, the invention is not limited thereto. In an embodiment, for example, the other end of each protrusion pattern CP may not be connected to or meet the line area LA, and may be exposed to outside the display panel 100 without being connected to a separate component.

In a plan view, a remaining area of the second pixel area PXA2 except for a portion in which the protrusion pattern CP is connected to the first pixel area PXA1 and the line area LA may be exposed to outside the display panel 100. In other words, the remaining area except for the portion in which the protrusion pattern CP is connected to the first pixel area PXA1 and the line area LA may be separated from the first pixel area PXA1 and the line area LA. A plurality of protrusion patterns CP may be provided, and in this case, at least some areas of the protrusion patterns CP adjacent to each other may be physically separated and spaced apart from each other.

In a plan view, an end or edge of the first pixel area PXA1 from which the plurality of protrusion patterns CP protrude may include a curved line, and in this case, directions in which the plurality of protrusion patterns CP protrudes may be different from each other. However, the invention is not limited thereto. Each of the protrusions patterns CP has a length taken from the end or edge of the first pixel area PXA1 (e.g., protruding direction) and a width which is perpendicular to the length. The lengths of the protrusion patterns CP in a direction in which the protrusion patterns CP protrude from the first pixel area PXA1 may be different from each other. The length of the protrusion pattern CP in a direction in which the protrusion pattern CP protrudes from the first pixel area PXA1 may be greater than the width thereof in a direction perpendicular to the protruding direction.

The width of each of the protrusion patterns CP may decrease in a direction from the first pixel area PXA1 toward the line area LA. In this case, each of the protrusion patterns CP may have a trapezoidal shape in a plan view, but the invention is not limited thereto. When each of the protrusion pattern CP has a trapezoidal shape, one side of the trapezoid may be connected to or meet the first pixel area PXA1, the side opposite to the one side thereof may be connected to or meet the line area LA, and remaining two sides thereof may be separated from each other without being connected to other components.

The plurality of protrusion patterns CP may face each other. In other words, the plurality of protrusion patterns CP may be spaced apart from each other with the cutout portion CG interposed therebetween, and side surfaces of each protrusion pattern CP may face each other in a direction along the edge of the first pixel area PXA1. The plurality of protrusion patterns CP may be divided by the cutout portions CG. In an embodiment, within a corner portion, the protrusion patterns CP are arranged between a first bent portion (e.g., first bending area BS1) and a second bent portion (e.g., second bending area BS2) and disconnected from each other in a direction from the first bent portion to the second bent portion. In a plan view, the interval between the protrusion patterns CP adjacent to each other may increase in the direction toward the line area LA from the first pixel area PXA1.

The display panel 100 which is unbent, unfolded or unrolled disposes the protrusion patterns CP spaced apart from each other by an original interval (refer to FIG. 4). The display panel 100 which is bent, folded or rolled disposes the protrusion patterns CP bent, folded or rolled (refer to FIG. 5). The protrusion patterns CP are each bendable relative to the main portion MS and partially disconnected from each other to be moveable relative to each other. When the protrusion patterns CP are bent, an original interval between the protrusion patterns CP adjacent to each other may decrease, or the protrusion patterns CP adjacent to each other may directly contact each other (refer to FIG. 5). When the protrusion patterns CP adjacent to each other directly contact each other, a physical interface (or a boundary) may be defined between the protrusion patterns CP adjacent to each other (refer to FIG. 5). However, the invention is not limited thereto, and when the protrusion patterns CP are bent, the protrusion patterns CP adjacent to each other may overlap each other. Moreover, when the protrusion patterns CP are bent, the interval between second pixels PX2 within the second pixel area PXA2 at the protrusion patterns CP may decrease.

Further, the display panel 100 which is bent, folded or rolled disposes the protrusion pattern CP which is outermost among the plurality of protrusion patterns CP in direct contact the bent portions BS1, BS2, BS3, and BS4 which are adjacent to each other (refer to FIG. 5). In this case, a physical interface (or a boundary) may be located between the protrusion pattern CP and the first pixel area PXA1 adjacent to this protrusion pattern CP and disposed in the bending portions BS1, BS2, BS3, and BS4.

The protrusion pattern CP which is bent, the protrusion pattern CP may have a rounded shape of a double curvature. In other words, the protrusion pattern CP may have a rounded shape of the same double curvature as the second pixel area PXA2. A stacked structure of the protrusion patterns CP will be described later.

The display panel 100 may further include a bending area BA and a pad area PA. A pad may be provided in plural including a plurality of pads PAD in the pad area PA.

The bending area BA may extend from the lower side of the line area LA in a plan view. The bending area BA may be disposed between the line area LA and the pad area PA. The length of the bending area BA along the first direction DR1 may be smaller than the length of the line area LA along the first direction DR1. The display panel 100 may be bendable at the bending area BA along a fifth bending line BL5 at the lower side of the line area LA.

The pad area PA may extend downward from the bending area BA in a plan view. The length of the pad area PA along the first direction DR1 may be greater than the length of the bending area BA along the first direction DR1, but the invention is not limited thereto.

The length of the pad area PA along the first direction DR1 may be substantially the same as the length of the bending area BA along the first direction DR1. The display panel 100 may be bendable at the pad area PA along a sixth bending line BL6 at the lower side of the bending area BA. The display panel 100 which is bent disposes the pad area PA on the lower surface of the main portion MS.

An integrated driving circuit IDC and pads PAD may be arranged on the display panel 100 at the pad area PA. The integrated driving circuit IDC may be provided or formed as an integrated circuit ("IC"). The integrated driving circuit IDC may be attached onto the display panel 100 at the pad area PA by a chip on glass ("COG") method, a chip on plastic ("COP") method, or an ultrasonic bonding method. Alternatively, the integrated driving circuit IDC may be disposed on a circuit board separate from the display panel 100 and facing the pads PAD in the pad area PA.

The integrated driving circuit IDC may be electrically connected to the pads PAD in the pad area PA. The integrated driving circuit IDC may receive electrical signals such as a digital video data and timing signals from outside the display panel 100 and through the pads PAD of the pad area PA. The integrated driving circuit IDC may convert digital video data into analog data voltages and output the analog data voltages to signal lines (e.g., data lines) of the display area DA.

Figure 6:
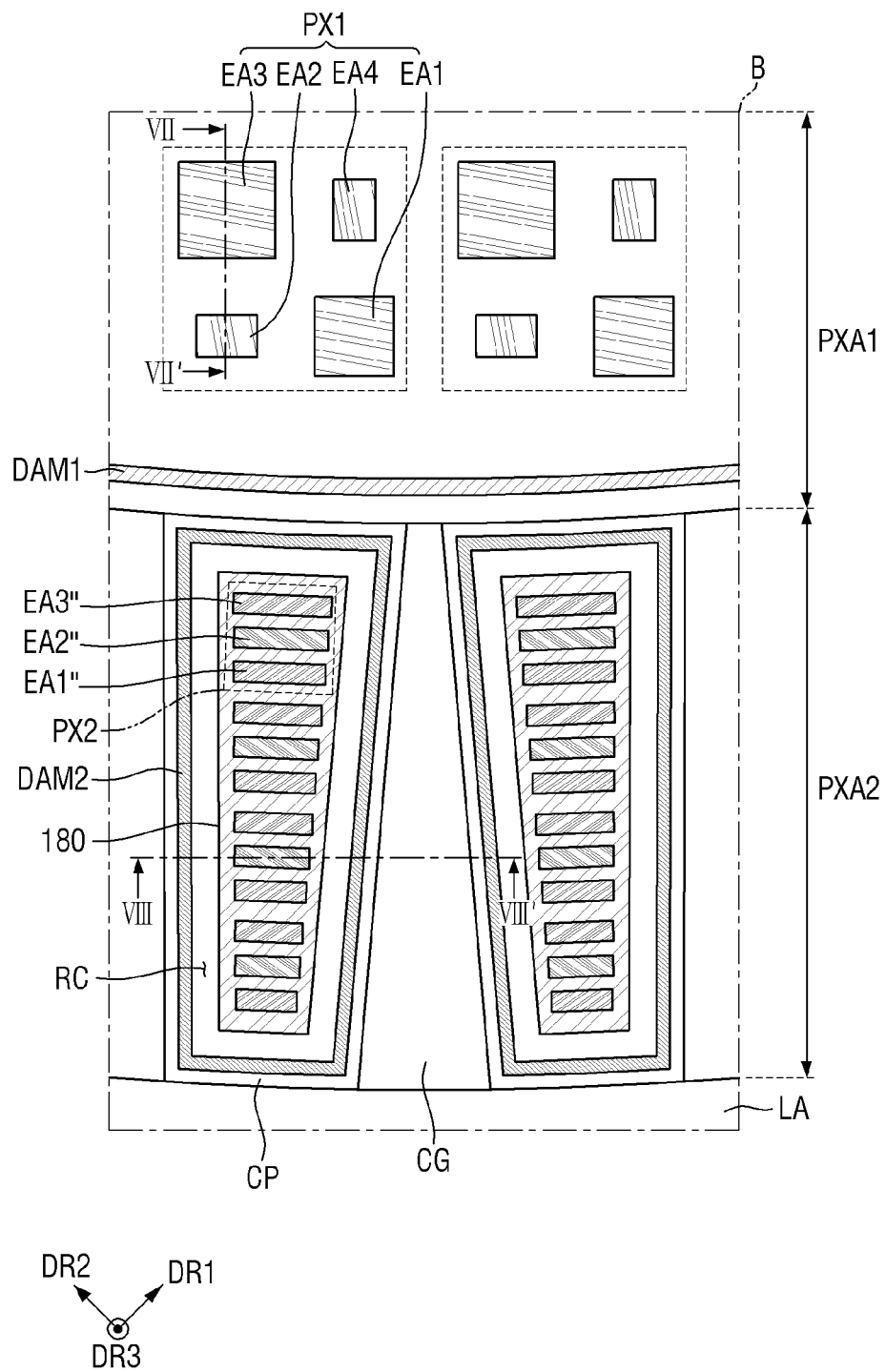
FIG. 6 is an enlarged view of an embodiment of area B of FIG. 4.
Figure 7:
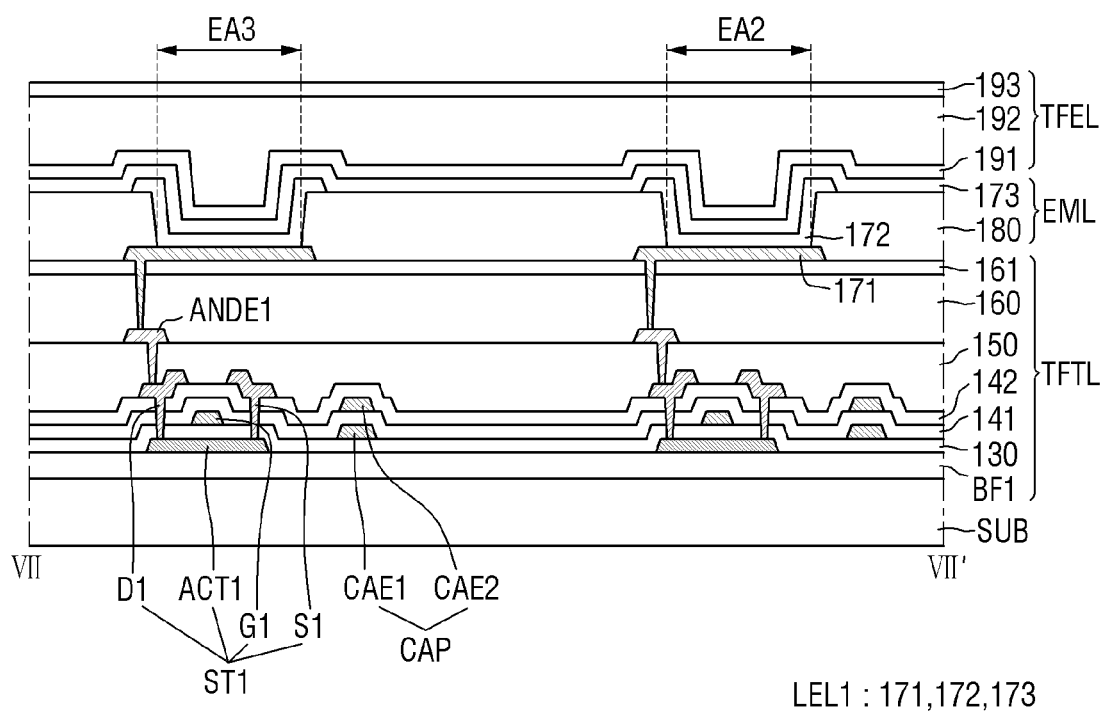
FIG. 7 is a cross-sectional view taken along line VII-VII' of FIG. 6.
Figure 8:
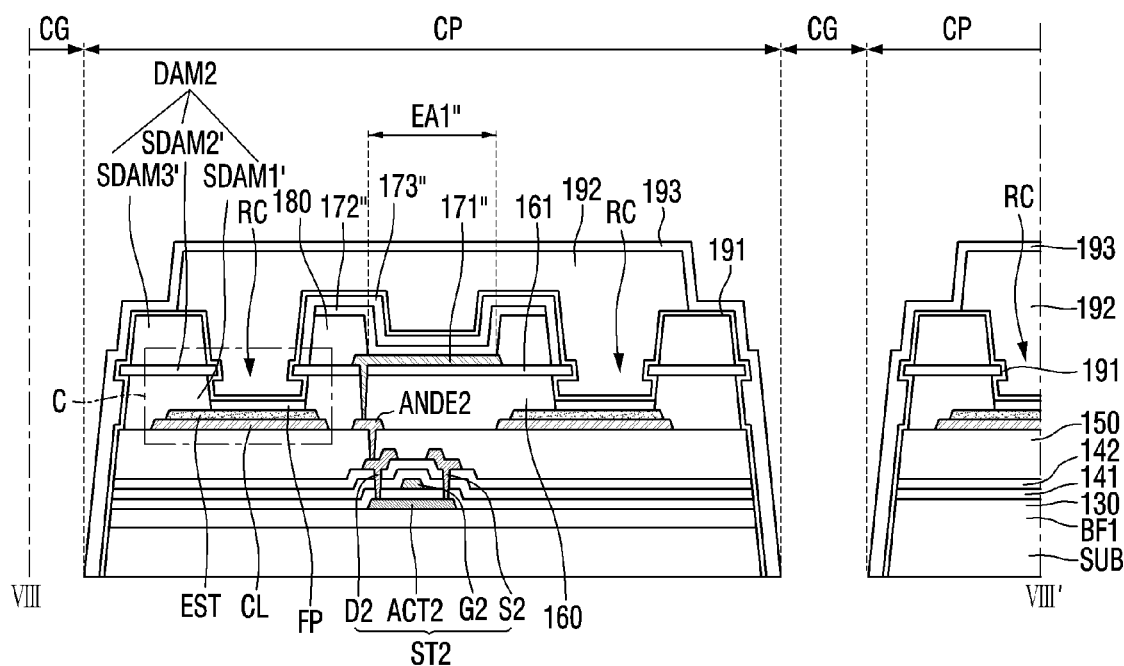
FIG. 8 is a cross-sectional view taken along line VIII-VIII' of FIG. 6.
Figure 9:
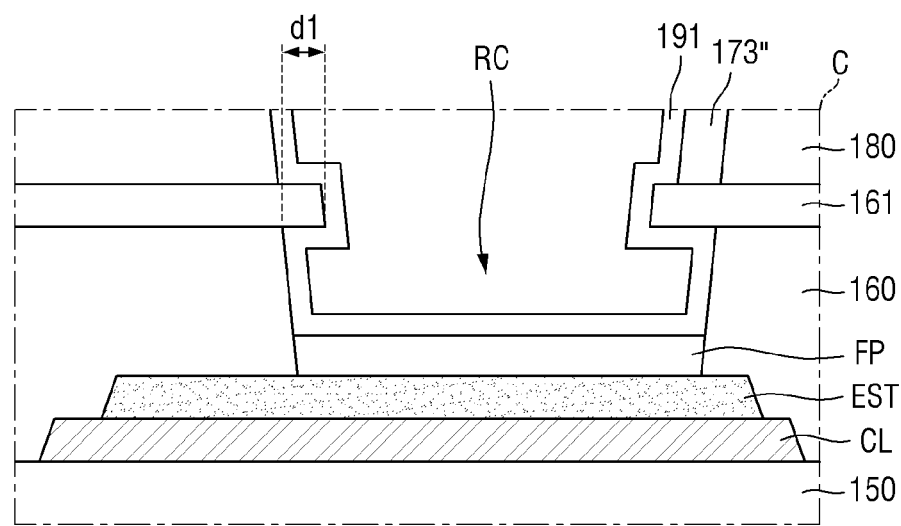
FIG. 9 is an enlarged view of an embodiment of area C of FIG. 8.

FIG. 6 is an enlarged view of area B of FIG. 4. FIG. 7 is a cross-sectional view taken along line VII-VII' of FIG. 6. FIG. 8 is a cross-sectional view taken along line VIII-VIII' of FIG. 6. FIG. 9 is an enlarged view of area C of FIG. 8. FIG. 7 illustrates a stacked structure of the first pixel area PXA1, and FIG. 8 illustrates a stacked structure of the second pixel area PXA2.

Referring to FIG. 6, the first pixel area PXA1 may include a plurality of display pixels including a first pixel PX1 provided in plural including a plurality of first pixels PX1, and the second pixel area PXA2 may include a plurality of display pixels including a second pixel PX2 provided in plural including a plurality of second pixels PX2.

Each of the plurality of first pixels PX1 of the first pixel area PXA1 may include a plurality of light emission areas EA1, EA2, EA3, and EA4. In an embodiment, for example, each of the plurality of first pixels PX1 may include a first light emission area EA1, a second light emission area EA2, a third light emission area EA3, and a fourth light emission area EA4. The first light emission area EA1, the second light emission area EA2, the third light emission area EA3, and the fourth light emission area EA4 may emit light of different colors from each other, but the invention is not limited thereto.

The first pixel area PXA1 may further include a first dam DAM1. The first dam DAM1 may be disposed along the edge of the first pixel area PXA1. The first dam DAM1 may be common to each of the first pixels PX1. The first dam DAM1 may surround the plurality of first pixels PX1 of the first pixel area PXA1 in a plan view. The first dam DAM1 may serve to suppress or prevent an organic material layer of the first pixel area PXA1 from overflowing to outside of the first pixel area PXA1.

Each of the plurality of second pixels PX2 of the second pixel area PXA2 may include a plurality of light emission areas EA1', EA2', and EA3'. In an embodiment, for example, each of the plurality of second pixels PX2 may include a first light emission area EA1', a second light emission area EA2', and a third light emission area EA3'. The first light emission area EA1', the second light emission area EA2', and the third light emission area EA3' may emit light of different colors from each other, but the invention is not limited thereto.

The second pixel area PXA2 may further include a second dam DAM2 which is provided in plural including a plurality of second dams DAM2 respectively corresponding to the protrusion patterns CP. The second dam DAM2 may be disposed along the edge of each protrusion pattern CP of the second pixel area PXA2. In other words, the second dam DAM2 may be disposed for each of the protrusion patterns CP, and may surround the plurality of second pixels PX2 disposed on each protrusion pattern CP, respectively. The second dam DAM2 may serve to suppress or prevent an organic material layer of each protrusion pattern CP of the second pixel area PXA2 from overflowing to the outside of each protrusion pattern CP of the second pixel area PXA2.

In each of the protrusion patterns CP of the second pixel area PXA2, a recess pattern RC (e.g., recess) may be disposed in or defined by portions of the second dam DAM2. The light emitting layer 172" of each second pixel PX2 of the second pixel area PXA2 may be separated and spaced apart from a dummy light emitting layer FP (refer to FIG. 8) disposed in the recess pattern RC by the recess pattern RC. The dummy light emitting layer FP may suppress or prevent external air and moisture from penetrating into the light emitting layer 172" of each second pixel PX2 of the second pixel area PXA2. Accordingly, reliability of the second pixel PX2 in the second pixel area PXA2 may be improved. Details thereof will be described later.

A stacked structure of the first pixel area PXA1 of the display panel 100 will be described with reference to FIG. 7. The first pixel area PXA1 of the display panel 100 may include a substrate SUB, a thin film transistor layer TFTL, a light emitting element layer EML, and a thin film encapsulation layer TFEL.

The substrate SUB may support components disposed on the substrate SUB. The substrate SUB may include or be made of an insulating material such as a polymer resin, or include or may be made of an inorganic material such as glass or quartz. However, the invention is not limited thereto, and the substrate SUB may be a transparent plate or a transparent film.

The substrate SUB may be a flexible substrate which is bendable, foldable, rollable or the like, but is not limited thereto, and may be a rigid substrate.

The thin film transistor layer TFTL is disposed on the substrate SUB. The thin film transistor layer TFTL may include a first thin film transistor ST1, a first connection electrode ANDE1, a first buffer layer BF1, a gate insulating layer 130, a first interlayer insulating layer 141, a second interlayer insulating layer 142, a first planarization layer 150, and a second planarization layer 160. The first thin film transistor ST1 and the first connection electrode ANDE1 may be provided in plural within the first pixel area PXA1.

The first buffer layer BF1 may be disposed on the substrate SUB. The first buffer layer BF1 may block impurities that may penetrate from thereunder, improve the adhesion of overlying components, and perform a flattening function. The first buffer layer BF1 may include or be formed of a silicon nitride layer, a silicon oxynitride layer, a silicon oxide layer, a titanium oxide layer, or an aluminum oxide layer.

A first thin film transistor ST1 may be disposed on the first buffer layer BF1. The first thin film transistor ST1 may include a first active layer ACT1, a first gate electrode G1, a first source electrode S1, and a first drain electrode D1.

The first active layer ACT1 of the first thin film transistor ST1 may be disposed on the first buffer layer BF1. The first active layer ACT1 may include a silicon semiconductor such as polycrystalline silicon, single crystal silicon, low-temperature polycrystalline silicon, or amorphous silicon. In an area overlapping the first gate electrode G1 along the thickness direction (third direction DR3), the first active layer ACT1 may include a channel region and source/drain regions disposed on one side and the other side of the channel region.

The gate insulating layer 130 may be disposed on the first active layer ACT1 of the first thin film transistor ST1. The gate insulating layer 130 may include or be formed of an inorganic layer, for example, a silicon nitride layer, a silicon oxynitride layer, a silicon oxide layer, a titanium oxide layer, or an aluminum oxide layer.

The first gate electrode G1 of the first thin film transistor ST1 and a first capacitor electrode CAE1 may be disposed on the gate insulating layer 130. The first gate electrode G1 of the first thin film transistor ST1 may overlap the first active layer ACT1 along the third direction DR3. The first capacitor electrode CAE1 may overlap a second capacitor electrode CAE2 along the third direction DR3. Each of the first gate electrode G1 and the first capacitor electrode CAE1 may include or be formed as a single layer or multiple layers including any one of molybdenum (Mo), aluminum (Al), chromium (Cr), gold (Au), titanium (Ti), nickel (Ni), and neodymium (Nd), and copper (Cu), or an alloy thereof.

The first interlayer insulating layer 141 may be disposed on the first gate electrode G1 and the first capacitor electrode CAE1. The first interlayer insulating layer 141 may include an inorganic layer.

The second capacitor electrode CAE2 may be disposed on the first interlayer insulating layer 141. The second capacitor electrode CAE2 may overlap the first capacitor electrode CAE1 along the third direction DR3. A capacitor CAP may be provided or formed by the first capacitor electrode CAE1, the second capacitor electrode CAE2, and the first interlayer insulating layer 141. The second capacitor electrode CAE2 may include or be formed as a single layer or multiple layers including any one of molybdenum (Mo), aluminum (Al), chromium (Cr), gold (Au), titanium (Ti), nickel (Ni), and neodymium (Nd), and copper (Cu), or an alloy thereof.

The second interlayer insulating layer 142 may be disposed on the second capacitor electrode CAE2. The second interlayer insulating layer 142 may include an inorganic layer.

A first source electrode S1 and a first drain electrode D1 of the first thin film transistor ST1 may be disposed on the second interlayer insulating layer 142. Each of the first source electrode S1 and the first drain electrode D1 may include or be formed as a single layer or multiple layers including any one of molybdenum (Mo), aluminum (Al), chromium (Cr), gold (Au), titanium (Ti), nickel (Ni), and neodymium (Nd), and copper (Cu), or an alloy thereof.

The first source electrode S1 of the first thin film transistor ST1 may be connected to a conductive region disposed at one side of the channel region of the first active layer ACT1 through a contact hole penetrating the gate insulating layer 130, the first interlayer insulating layer 141, and the second interlayer insulating layer 142. The first drain electrode D1 of the first thin film transistor ST1 may be connected to a conductive region disposed at the other side of the channel region of the first active layer ACT1 through a contact hole penetrating the gate insulating layer 130, the first interlayer insulating layer 141, and the second interlayer insulating layer 142.

The first planarization layer 150 may be disposed on the first source electrode S1 and the first drain electrode D1 to flatten a step formed due to layers of the thin film transistors. The first planarization layer 150 may include or be formed of an organic material such as acrylic resin, epoxy resin, phenolic resin, polyamide resin, or polyimide resin.

The first connection electrode ANDE1 may be disposed on the first planarization layer 150. The first connection electrode ANDE1 may be connected to the first source electrode S1 or the first drain electrode D1 of the first thin film transistor ST1 through a contact hole penetrating the first planarization layer 150. The first connection electrode ANDE1 may include or be formed as a single layer or multiple layers including any one of molybdenum (Mo), aluminum (Al), chromium (Cr), gold (Au), titanium (Ti), nickel (Ni), and neodymium (Nd), and copper (Cu), or an alloy thereof.

The second planarization layer 160 may be disposed on the first connection electrode ANDE1. The second planarization layer 160 may include an organic material such as acrylic resin, epoxy resin, phenolic resin, polyamide resin, or polyimide resin.

A barrier layer 161 may be disposed on the second planarization layer 160. The barrier layer 161 may include an inorganic layer. The second planarization layer 160 and the barrier layer 161 are in order toward the pixel defining layer 180.

The light emitting element layer EML is disposed on the thin film transistor layer TFTL. The light emitting element layer EML may include a first light emitting element LEL1 provided in plural including a plurality of first light emitting elements LEL1 and a pixel defining layer 180.

Each of the first light emitting elements LEL1 may include a pixel electrode 171, a light emitting layer 172, and a common electrode 173. Each of the light emission areas EA1, EA2, EA3, and EA4 refers to a planar area where a pixel electrode 171, a light emitting layer 172, and a common electrode 173 are sequentially stacked. Holes from the pixel electrode 171 are combined with electrons from the common electrode 173 in the light emitting layer 172 to emit light. In this case, the pixel electrode 171 may be an anode electrode, and the common electrode 173 may be a cathode electrode. A stacked structure of each of the first light emission area EA1, the second light emission area EA2, and the fourth light emission area EA4 may be substantially the same as the third light emission area EA3 illustrated in FIG. 6.

Specifically, the pixel electrode 171 may be disposed on the barrier layer 161. The pixel electrode 171 may be connected to the first connection electrode ANDE1 through a contact hole penetrating the barrier layer 161 and the second planarization layer 160.

In a top emission structure in which light is emitted from the light emitting layer 172 toward the common electrode 173, the pixel electrode 171 includes or is formed as a single layer of molybdenum (Mo), titanium (Ti), copper (Cu), or aluminum (Al), or may be formed to have a stacked structure (Ti/Al/Ti) of aluminum and titanium, a stacked structure (ITO/Al/ITO) of aluminum and ITO, an APC alloy structure, or a stacked structure (ITO/APC/ITO) of APC alloy and ITO. The APC alloy is an alloy of silver (Ag), palladium (Pd), and copper (Cu).

The pixel defining layer 180 serves to define the light emission areas EA1, EA2, EA3, and EA4 of the display pixels. For this purpose, the pixel defining layer 180 may be provided or formed on the barrier layer 161 to expose a part of the pixel electrode 171 to outside the pixel defining layer 180. The pixel defining layer 180 may cover an edge of the pixel electrode 171. The pixel defining layer 180 may be disposed in a contact hole penetrating the barrier layer 161 and the second planarization layer 160. Accordingly, the contact hole penetrating the barrier layer 161 and the second planarization layer 160 may be filled by the pixel defining layer 180. The pixel defining layer 180 may include or be formed of an organic material such as acrylic resin, epoxy resin, phenolic resin, polyamide resin, or polyimide resin.

The light emitting layer 172 is disposed on the pixel electrode 171 exposed to outside the pixel defining layer 180. The light emitting layer 172 may include an organic material and emit light of a color. In an embodiment, for example, the light emitting layer 172 may include a hole injection/transporting layer, an organic material layer, and an electron injection/transporting layer. The organic material layer may include a host and a dopant. The organic material layer may include a material emitting light of a color, and may be provided or formed using a phosphorescent material or a fluorescent material.

The common electrode 173 is disposed on the light emitting layer 172. The common electrode 173 may cover the light emitting layer 172. The common electrode 173 may be a common layer commonly provided in more than one of the display pixels. A capping layer (not shown) may be provided or formed on the common electrode 173.

In the top emission structure, the common electrode 173 may include or be formed of a transparent conductive material such as ITO or IZO that can transmit light, or may include or be formed of a semi-transmissive metal material such as magnesium (Mg), silver (Ag), or an alloy of magnesium (Mg) and silver (Ag). When the common electrode 173 includes or is formed of a semi-transmissive metal material, light emission efficiency may be increased due to micro cavities.

The thin film encapsulation layer TFEL may be provided or formed on the light emitting element layer EML. The thin film encapsulation layer TFEL may include at least one inorganic layer to reduce or effectively prevent oxygen or moisture from penetrating into the light emitting element layer EML. Further, the thin film encapsulation layer TFEL may include at least one organic layer to protect the light emitting element layer EML from foreign matter (particles).

In an embodiment, for example, the thin film encapsulation layer TFEL includes a first encapsulation inorganic layer 191 disposed on the common electrode 173, an encapsulation organic layer 192 disposed on the first encapsulation inorganic layer 191, and a second encapsulation inorganic layer 193 disposed on the encapsulation organic layer 192. Each of the first encapsulation inorganic layer 191 and the second encapsulation inorganic layer 193 may include or be formed as multiple layers in which one or more inorganic layers of a silicon nitride layer, a silicon oxy nitride layer, a silicon oxide layer, a titanium oxide layer, and an aluminum oxide layer are alternately stacked. The organic layer may include at least one of an acrylic resin, an epoxy resin, a phenolic resin, a polyamide resin, and a polyimide resin.

Although not shown, a touch member may be further disposed on the thin film encapsulation layer TFEL. The touch member may be provided on the thin film encapsulation layer TFEL as a separate configuration from the display panel 100, or may be provided integrally with the display panel 100. The touch member may provide a touch function of the display device 10.

A stacked structure of the second pixel area PXA2 of the display panel 100 will be described with reference to FIGS. 8 and 9. The stacked structure of the second pixel area PXA2 may be substantially the same as the stacked structure of the first pixel area PXA1. Hereinafter, overlapping descriptions are omitted, and only differences will be described.

The second pixel area PXA2 may include a second thin film transistor ST2, a second light emitting element LEL2, and a thin film encapsulation layer TFEL. The second thin film transistor ST2 may include a second active layer ACT2, a second gate electrode G2, a second source electrode S2, and a second drain electrode D2. The second thin film transistor ST2 may have substantially the same configuration as the first thin film transistor ST1 of the first pixel area PXA1 of FIG. 7. Therefore, a detailed description of the second thin film transistor ST2 will be omitted.

The second light emitting element LEL2 of the second pixel area PXA2 may include a pixel electrode 171", a light emitting layer 172", and a common electrode 173". The second light emitting element LEL2 of the second pixel area PXA2 may have substantially the same configuration as the first light emitting element LEL1 of the light emitting element layer EML of FIG. 7. Accordingly, a description of the second light emitting element LEL2 of the second pixel area PXA2 will be omitted. Moreover, the pixel electrode 171" of the second light emitting element LEL2 and the second drain electrode D2 of the second thin film transistor ST2 may be electrically connected to each other by the second connection electrode ANDE2 disposed on the first planarization layer 150. The second thin film transistor ST2 and the second connection electrode ANDE2 may be provided in plural within the second pixel area PXA2.

The thin film encapsulation layer TFEL of the second pixel area PXA2 may include a first encapsulation inorganic layer 191, an encapsulation organic layer 192, and a second encapsulation inorganic layer 193. The thin film encapsulation layer TFEL of the second pixel area PXA2 may have substantially the same configuration as the thin film encapsulation layer TFEL of the first pixel area PXA1. The thin film encapsulation layer TFEL of the second pixel area PXA2 may be an extended portion of the thin film encapsulation layer TFEL of the first pixel area PXA1. Accordingly, a description of the thin film encapsulation layer TFEL of the second pixel area PXA2 will be omitted.

Further, the first encapsulation inorganic layer 191 and the second encapsulation inorganic layer 193 may be disposed on a cutout surface or side surface of the protrusion pattern CP. In an embodiment, for example, the first encapsulation inorganic layer 191 and the second encapsulation inorganic layer 193 may be disposed along outer sidewalls of the substrate SUB, the first buffer layer BF1, the gate insulating layer 130, the first interlayer insulating layer 141, the second interlayer insulating layer 142, the first planarization layer 150, the second planarization layer 160, the barrier layer 161 and the pixel defining layer 180 which define the cutout surface or side surface of the protrusion pattern CP in the protrusion pattern CP. Thus, it is possible to reduce or effectively prevent the light emitting layer 172" from being damaged by inflow of moisture or oxygen through the cutout surface or side surface of the protrusion pattern CP.

The second pixel area PXA2 may further include a barrier layer 161. The barrier layer 161 may be disposed between the second planarization layer 160 and the pixel electrode 171". The barrier layer 161 may include an inorganic layer.

In the second pixel area PXA2, the second dam DAM2 may be disposed on the first planarization layer 150. The second dam DAM2 may include a first sub-dam SDAM1' including of formed of the same material as the second planarization layer 160, a second sub-dam SDAM2' including or formed of the same material as the barrier layer 161, and a third sub-dam SDAM3' including or formed of the same material as the pixel defining layer 180. The first sub-dam SDAM1', the second sub-dam SDAM2', and the third sub-dam SDAM3' may be sequentially stacked in order from the substrate SUB. The first sub-dam SDAM1', the second sub-dam SDAM2' and the third sub-dam SDAM3' may be portions or patterns of the second planarization layer 160, the barrier layer 161, and the pixel defining layer 180, respectively (e.g., in a same layer as each other). In an embodiment, for example, the first encapsulation inorganic layer 191 and the second encapsulation inorganic layer 193 may be disposed along outer sidewalls of the substrate SUB, the first buffer layer BF1, the gate insulating layer 130, the first interlayer insulating layer 141, the second interlayer insulating layer 142, the first planarization layer 150, first sub-dam SDAM1', the second sub-dam SDAM2', and the third sub-dam SDAM3' which define the cutout surface or side surface of the protrusion pattern CP in the protrusion pattern CP.

In the second pixel area PXA2, a conductive line CL and an etch prevention pattern EST may be further disposed on the first planarization layer 150. The conductive line CL may be disposed on the first planarization layer 150, and may be electrically connected to the second pixel PX2 to apply a voltage or transmit a driving signal thereto. At least a part of the conductive line CL may overlap the second dam DAM2 along the thickness direction (third direction DR3), but the invention is not limited thereto.

The etch prevention pattern EST may be disposed on the conductive line CL. At the recess (e.g., recess pattern RC), the conductive line CL and the etch prevention pattern EST are in order toward the pixel defining layer 180. The etch prevention pattern EST may overlap the conductive line CL along the thickness direction (third direction DR3). The etch prevention pattern EST may include an inorganic material, but the invention is not limited thereto. The etch prevention pattern EST may be disposed around the second dam DAM2, and may serve as an etch stopper in the process of providing or forming the second dam DAM2. The etch prevention pattern EST may reduce or effectively prevent the conductive line CL from being damaged by etching of overlying material layers. At least a part of the etch prevention pattern EST may overlap the second dam DAM2 along the thickness direction (third direction DR3).

Although will be described later, the barrier layer 161 may be disposed on the etch prevention pattern EST in the process of providing or forming the recess pattern RC, thereby suppressing or preventing the over-etching of the etch prevention pattern EST. Accordingly, the thickness of the etch prevention pattern EST may be uniform over an entirety of the area thereof, but the invention is not limited thereto.

The second pixel area PXA2 may further include a recess pattern RC exposing the etch prevention pattern EST to outside the second planarization layer 160, the barrier layer 161, and the pixel defining layer 180. The recess pattern RC may overlap the etch prevention pattern EST and the conductive line CL along the thickness direction (third direction DR3). The recess pattern RC may be located or defined within the second dam DAM2 of each protrusion pattern CP. That is, portions of the second dam DAM2 may define the recess pattern RC. The recess pattern RC may be disposed between the second dam DAM2 and the pixel defining layer 180 of the display pixels in a plan view. In other words, the recess pattern RC may be located outside the light emission areas EA1", EA2", and EA3", or the light emitting layer 172 of the second pixel PX2 in a plan view. The recess pattern RC may surround the pixel defining layer 180 in a plan view, and may cover the light emission areas EA1", EA2", and EA3", or the light emitting layer 172" of the second pixel PX2, but the invention is not limited thereto.

The recess pattern RC may penetrate the barrier layer 161 and the second planarization layer 160 along the thickness direction. The recess pattern RC may be defined by portions of the barrier layer 161 and the second planarization layer 160. In other words, the recess pattern RC may be defined by removing at least a part of the second planarization layer 160 and/or at least a part of the barrier layer 161. In this case, a sidewall of the recess pattern RC may be provided or formed by sidewalls of the second planarization layer 160 and the barrier layer 161. A sidewall of the recess pattern RC may be provided or formed by sidewalls of the first sub-dam SDAM1' and the second sub-dam SDAM2' as respective portions of the second planarization layer 160 and the barrier layer 161.

However, the invention is not limited thereto, and the sidewall of the recess pattern RC may be provided or formed by a sidewall of the pixel defining layer 180 in addition to the sidewalls the second planarization layer 160 and the barrier layer 161. The sidewall of the recess pattern RC may be provided or formed by a sidewall of the third sub-dam SDAM3' as a respective portion of the pixel defining layer 180 in addition to the sidewalls of the first sub-dam SDAM1' and the second sub-dam SDAM2'. A bottom the recess pattern RC may include a top surface of an etch prevention pattern EST which is furthest from the substrate SUB.

The recess pattern RC may have an under-cut shape. The under-cut shape refers to a shape in which the size of an inlet is smaller than the size of a bottom in a cross-sectional view, or a shape in which the size of the inlet is smaller than the size of a region between the inlet and the bottom in a cross-sectional view. Referring to FIG. 8, for example, the inlet of the recess pattern RC may be defined by the barrier layer 161, and the bottom of the recess pattern RC may be defined at the etch prevention pattern EST. Thus, the size of the inlet of the recess pattern RC may be smaller than the size of the region between the inlet and bottom of the recess pattern RC.

The side surface of the barrier layer 161 may protrude outward from the side surface of the second planarization layer 160. Here, the "outward" refers to a direction toward the vicinity of the center of the recess pattern RC, or refers to a direction from one sidewall of the recess pattern RC toward the other sidewall of the recess pattern RC which faces the one sidewall thereof. In other words, the side surface of the barrier layer 161 may further protrude toward the vicinity of the center of the recess pattern RC from the side surface of the second planarization layer 160. A distance between the side surfaces of the barrier layer 161 constituting the sidewall of the recess pattern RC and facing each other with the recess pattern RC interposed therebetween, may be smaller than a distance between the side surfaces of the second planarization layer 160 constituting the sidewall of the recess pattern RC and facing each other with the recess pattern RC interposed therebetween.

Referring to FIG. 9, a length dl of a protruded portion of the barrier layer 161 which protrudes outward from the side surface of the second planarization layer 160 may be in the range of about 300 micrometers (μm) to about 1500 μm, about 500 μm to about 1200 μm, or about 700 μm to about 900 μm. A part of the lower surface of the barrier layer 161 may not be covered by or may not correspond to the second planarization layer 160.

The dummy light emitting layer FP may be disposed in the recess pattern RC. The dummy light emitting layer FP may be disposed on the etch prevention pattern EST exposed to outside the pixel defining layer 180, the second planarization layer 160 and the barrier layer 161 by the recess pattern RC. When the recess pattern RC has an under-cut shape, the light emitting layer 172" may not be disposed on the sidewall of the recess pattern RC at the second planarization layer 160. Accordingly, the light emitting layer 172" may be separated and spaced apart from the dummy light emitting layer FP. The dummy light emitting layer FP may be a residual layer or residual portion of the light emitting layer 172", the residual layer being separated and spaced apart from the light emitting layer 172" without being connected to the light emitting layer 172" (e.g., disconnected from). The dummy light emitting layer FP may include or be made of the same material as the light emitting layer 172".

A first encapsulation inorganic layer 191 may be disposed on the dummy light emitting layer FP to cover the dummy light emitting layer FP. An encapsulation organic layer 192 is disposed on the first encapsulation inorganic layer 191, and the encapsulation organic layer 192 may fill the recess pattern RC. Although not shown, a common electrode 173" may be further disposed on the dummy light emitting layer FP.

In the process of providing or forming the recess pattern RC, the barrier layer 161 may initially cover the underlying etch prevention pattern EST in the vicinity corresponding to the recess pattern RC. Accordingly, even when the process of providing or forming the recess pattern RC proceeds together with the process of providing or forming the cutout portion CG, over-etching of the etch prevention pattern EST may be suppressed or prevented, and exposure of the underlying conductive line CL may be suppressed or prevented. Moreover, when the common electrode 173" is disposed on the dummy light emitting layer FP, electrical short between the conductive line CL and the common electrode 173" may be suppressed or prevented, so that reliability of the display device 10 (refer to FIG. 1) may be improved.

Hereinafter, an embodiment of a method of manufacturing the display device 10 will be described with reference to FIGS. 10 to 13.

FIGS. 10 to 13 are cross-sectional views illustrating an embodiment of a method of manufacturing a display device 10. FIGS. 10 to 13 illustrate cross-sectional views for processes in providing the second pixel area PXA2 of the display panel 100.

Figure 10:
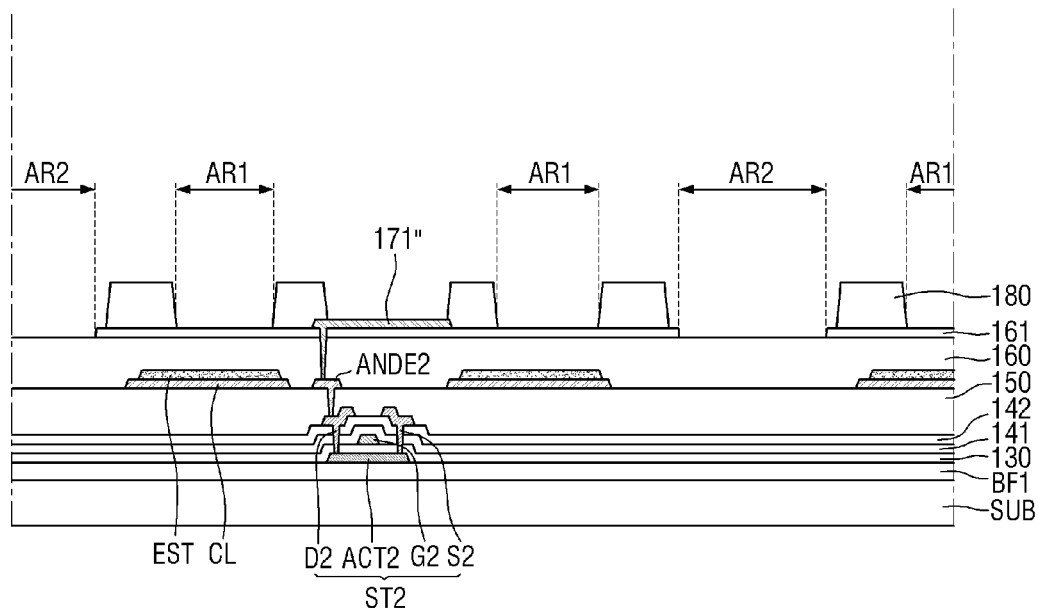
FIGS. 10 to 13 are cross-sectional views illustrating an embodiment of a method of manufacturing a display device.

Referring to FIG. 10, a second thin film transistor ST2 is provided or formed on a substrate SUB, and a first planarization layer 150 is provided or formed to cover the second thin film transistor ST2. The substrate SUB and the first planarization layer 150 in the second pixel area PXA2 may be respective portions of the substrate SUB and the first planarization layer 150 at the first pixel area PXA1. A second connection electrode ANDE2 and a conductive line CL are provided or formed on the first planarization layer 150, and an etch prevention pattern EST is provided or formed on the conductive line CL. A second planarization layer 160 covering the second connection electrode ANDE2, the conductive line CL, and the etch prevention pattern EST is provided or formed, and a barrier layer 161 is provided or formed on the second planarization layer 160.

The barrier layer 161 may be disposed in a first area AR1, and may not be disposed in a second area AR2 (e.g., may be excluded from the second area AR2). The first area AR1 and the second area AR2 may not overlap each other and may be spaced apart from each other along the substrate SUB. The barrier layer 161 may be disposed in an area other than the second area AR2 (e.g., except for the second area AR2). The first area AR1 may correspond to the recess pattern RC (refer to FIG. 8), and the second area AR2 may correspond to the cutout portion CG.

A material layer for a barrier layer 161 is provided or formed over the entire area of the substrate SUB. The material layer for the barrier layer 161 is etched away at the second area AR2 and is maintained at the first area AR1, thereby patterning the material layer to form the barrier layer 161 shown in FIG. 10.

The conductive line CL and the etch prevention pattern EST may be disposed in the first area AR1. The barrier layer 161 may overlap the conductive line CL and the etch prevention pattern EST along the thickness direction (third direction DR3), and may cover the conductive line CL and the etch prevention pattern EST. The barrier layer 161 may overlap an entirety of the conductive line CL and an entirety of the etch prevention pattern EST along the thickness direction (third direction DR3), and may cover the entire area of the conductive line CL and the entire area of the etch prevention pattern EST. However, the invention is not limited thereto.

A thin film transistor, a conductive line CL, and the etch prevention pattern EST may not be disposed in the second area AR2. The second area AR2 is a planar area includes portions of various layers which are removed. In an embodiment, portions of layers from the second planarization layer 160 or the pixel defining layer 180 to the substrate SUB are removed. A portion of the substrate SUB may also be removed at the second area AR2. In the second area AR2, portions of layers from the second planarization layer 160 or the pixel defining layer 180 to the substrate SUB are maintained. In an embodiment, an insulating layer and a planarization layer may remain in the first area AR1 among layers from the second planarization layer 160 or the pixel defining layer 180 to the substrate SUB.

Thereafter, a pixel electrode 171" is provided or formed on the barrier layer 161 (e.g., barrier layer pattern), and a pixel defining layer 180 is provided or formed to cover an edge of the pixel electrode 171". The pixel defining layer 180 exposes the pixel electrode 171" to outside the pixel defining layer 180. The pixel defining layer 180 may not be disposed in the first area AR1 corresponding to the recess pattern RC and the second area AR2 corresponding to the cutout portion CG. The pixel electrode 171" may correspond to a respective light emitting area. The pixel defining layer 180 may expose the barrier layer 161 in the first area AR1 to outside the pixel defining layer 180, and may expose the second planarization layer 160 in the second area AR2 to outside the pixel defining layer 180. However, the invention is not limited thereto, and the pixel defining layer 180 may be disposed in at least one of the first area AR1 and the second area AR2.

The pixel defining layer 180 may be provided or formed by providing a material layer for a pixel defining layer 180 over the entire area of the substrate SUB, etching the material layer for a pixel defining layer 180 located at the first area AR1 to expose the barrier layer 161 in the first area AR1, at the second area AR2 to expose the second planarization layer 160 in the second area AR2, and at the respective light emitting area to expose the pixel electrode 171" to outside of the pixel defining layer 180, as shown in FIG. 10.

Figure 11:
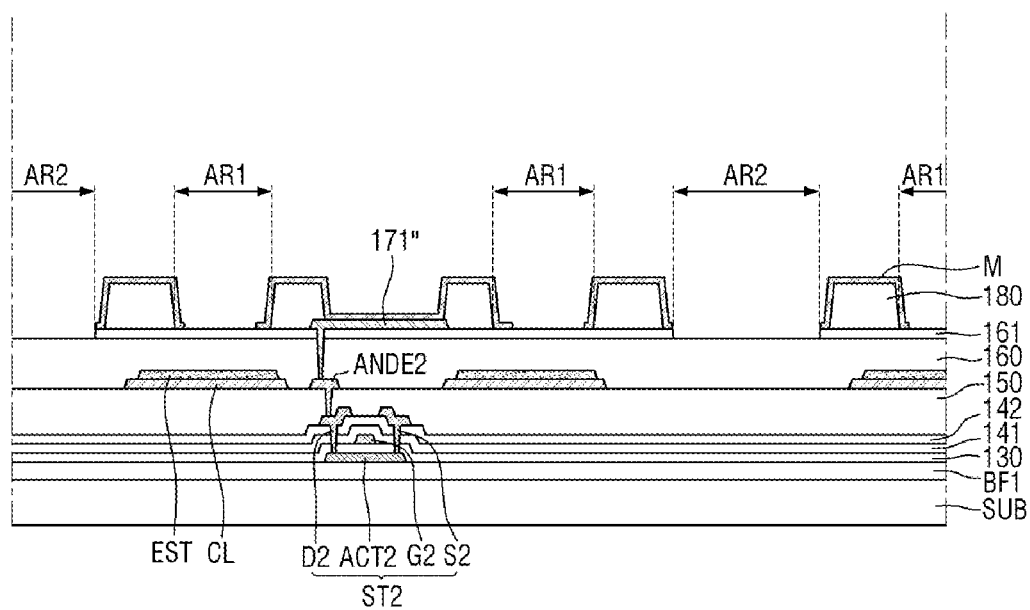

Referring to FIG. 11, a mask pattern M is provided or formed on the pixel defining layer 180. The mask pattern M is disposed on the pixel defining layer 180, and may not be disposed in the first area AR1 and the second area AR2. The mask pattern M may be disposed at the respective light emitting area. In other words, the mask pattern M may expose the barrier layer 161 in the first area AR1, and may expose the second planarization layer 160 in the second area AR2, to outside the mask pattern M.

The mask pattern M may include at least one of a transparent conductive oxide ("TCO") and an inorganic layer. Although not limited thereto, for example, the conductive oxide ("TCO") may include at least one of indium tin oxide ("ITO") and indium zinc oxide ("IZO"), and the inorganic layer may include aluminum (Al).

Figure 12:
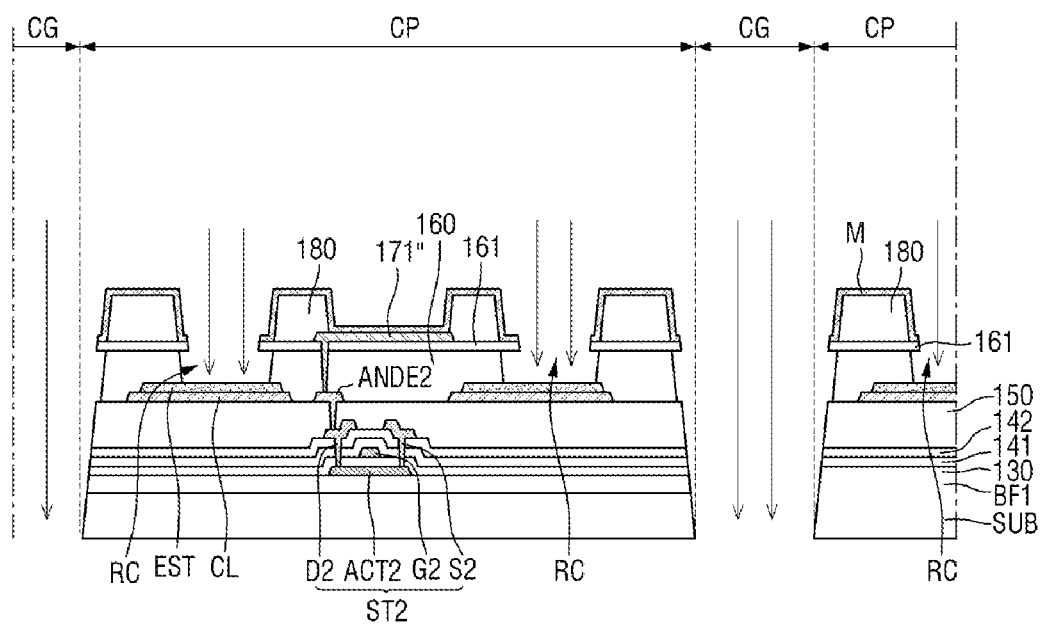

Referring to FIG. 12, the various layers in the first area AR1 and in the second area AR2 at which the mask pattern M is not disposed are etched using the mask pattern M to remove portions of the various layers.

Portions of the barrier layer 161 and the second planarization layer 160 in the first area AR1 are etched away by using the mask pattern M as an etching mask. Accordingly, a recess pattern RC may be provided or formed in the first area AR1. The recess pattern RC may be defined by sidewalls of the barrier layer 161 and the second planarization layer 160 and patterns thereof. In a final stacked structure where the mask pattern M is removed, the recess pattern RC may be further defined by a sidewall of the pixel defining layer 180 and a pattern thereof together with the sidewalls of the barrier layer 161 and the second planarization layer 160 and patterns thereof.

Further, portions of the second planarization layer 160, the first planarization layer 150, the second interlayer insulating layer 142, the first interlayer insulating layer 141, the gate insulating layer 130, the first buffer layer BF1 and the substrate SUB in the second area AR2 are etched away by using the mask pattern M as an etching mask. Accordingly, a cutout portion CG may be provided or formed in the second area AR2, and a protrusion pattern CP divided by the cutout portion CG may be provided or formed. In a final stacked structure where the mask pattern M is removed, the cutout portion CG may be defined by sidewalls of the pixel defining layer 180, the barrier layer 161, the second planarization layer 160, the first planarization layer 150, the second interlayer insulating layer 142, the first interlayer insulating layer 141, the gate insulating layer 130, the first buffer layer BF1 and the substrate SUB. The sidewalls of the protrusion pattern CP are exposed to outside the stacked structure by the cutout portion CG. In an embodiment, the cutout portion CG extends completely through a thickness of the display panel 100 to define the protrusion pattern CP thereof. In the second area AR2, the method may include providing a cutout portion CG which is extended through each of an inorganic layer (e.g., barrier layer 161), an organic layer (e.g., second planarization layer 160) and the substrate SUB and open at both of the substrate SUB and the inorganic layer.

The process of providing or forming the recess pattern RC by etching layers in the first area AR1 (indicated by downward arrows in FIG. 12) and the process of providing or forming the cutout CG by etching layers the second area AR2 (indicated by downward arrows in FIG. 12) may be performed together (e.g., at the same time, simultaneously, etc.). The process of providing or forming the recess pattern RC by etching layers in the first area AR1 and the process of providing or forming the cutout CG by etching layers in the second area AR2 may be performed by dry etching, but is not limited thereto, and may be performed by wet etching.

The depth of the recess pattern RC along the thickness direction (third direction DR3) may be smaller than the depth of the cutout portion CG along the thickness direction (third direction DR3). Accordingly, even when formation of the recess pattern RC is completed, an etching process may be continued until the cutout portion CG is provided or formed. In the continued etching of a stacked structure in a conventional display device, the etch prevention pattern EST may be over-etched to expose the conductive line CL to outside the recess pattern RC, or a defect such as an inverse taper may occur on the sidewall of the recess pattern RC.

However, in one or more embodiment, since the barrier layer 161 is disposed in the first area AR1 corresponding to the recess pattern RC and the barrier layer 161 is not disposed in the second area AR2 corresponding to the cutout portion CG, etching may be further performed downward from the second planarization layer 160 in the second area AR2, and etching may be performed downward from the barrier layer 161 in the first area AR1. Accordingly, it is possible to delay an etching time for completing the barrier layer 161 in the first area AR1, and it is possible to reduce the time for continuously etching the recess pattern RC until the cutout portion CG is completed after the completion of the recess pattern RC. That is, even though the providing of the recess pattern RC by etching layers in the first area AR1 and the providing of the cutout CG by etching layers the second area AR2 may be performed together, the barrier layer 161 disposed in the first area AR1 corresponding to the recess pattern RC and absent from the second area AR2 corresponding to the cutout portion CG delays etching of layers at the recess pattern RC until the cutout portion CG is completed.

Accordingly, suppression or prevention of over-etching of the etch prevention pattern EST which exposes the conductive line CL or suppression or prevention a defect such as an inverse taper from occurring on the sidewall of the recess pattern RC may be reduced or effectively prevented. Therefore, it is possible to suppress or prevent the conductive line CL and the common electrode 173" from contacting each other and thus being electrically shorted. Accordingly, it is possible to suppress or prevent the step coverage of the first encapsulation inorganic layer 191 at the recess pattern RC from being deteriorated. Moreover, reliability of the display device 10 (refer to FIG. 1) may be improved.

Figure 13:
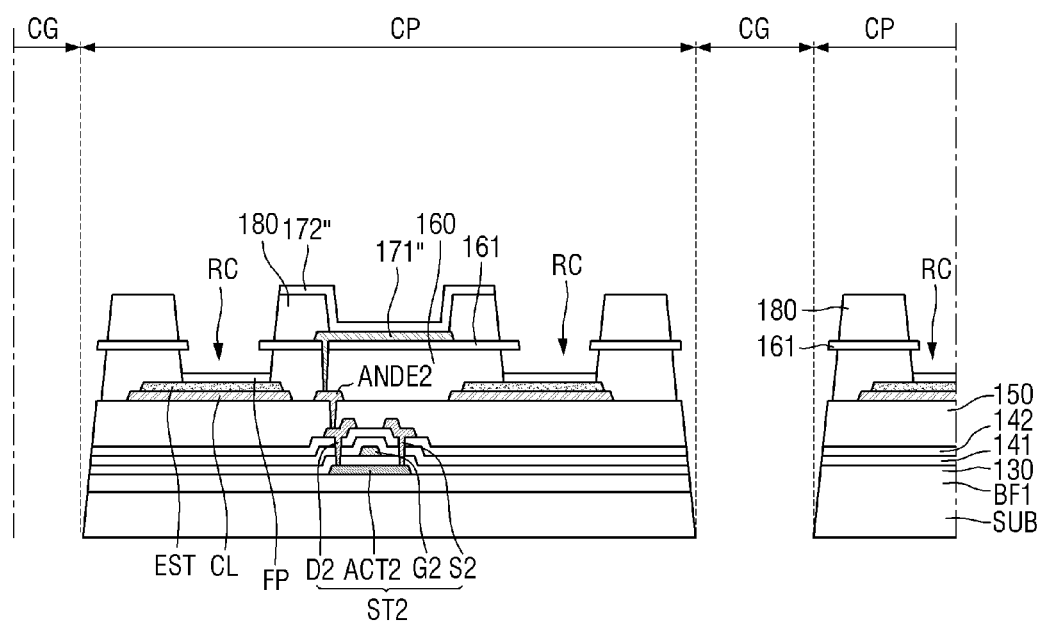

Referring to FIG. 13, the mask pattern M is removed, and a light emitting layer 172" is provided or formed. The light emitting layer 172" may be disposed on the pixel electrode 171" which is exposed by the pixel defining layer 180 to outside thereof. The light emitting layer 172" may extend from the pixel electrode 171", along a sidewall of the pixel defining layer 180 and along a top surface of the pixel defining layer 180 which is furthest from the substrate SUB. Further, a dummy light emitting layer FP may be provided or formed in the recess pattern RC. The dummy light emitting layer FP may be disposed on the etch prevention pattern EST.

Referring to FIG. 13, the width of each of the protrusion patterns CP may be as a maximum width of a layer, such as defined by the substrate SUB. A width of the cutout portion CG may be a minimum width, such as at facing sidewalls of the substrate SUB which define the cutout portion CG. A width of the recess pattern RC may be a minimum width, such as at facing sidewalls of the second planarization layer 160 and the first sub-dam SDAM1' which define the recess pattern RC. A distance between sidewalls of the barrier layer 161 at the recess pattern RC is smaller than the width thereof, while a distance between sidewalls of the barrier layer 161 at the cutout portion CG may be equal to or greater than the width thereof.

Hereinafter, further embodiments will be described. In the following embodiments, for the same components as those previously described, redundant descriptions will be omitted or simplified, and differences will be mainly described.

Figure 14:
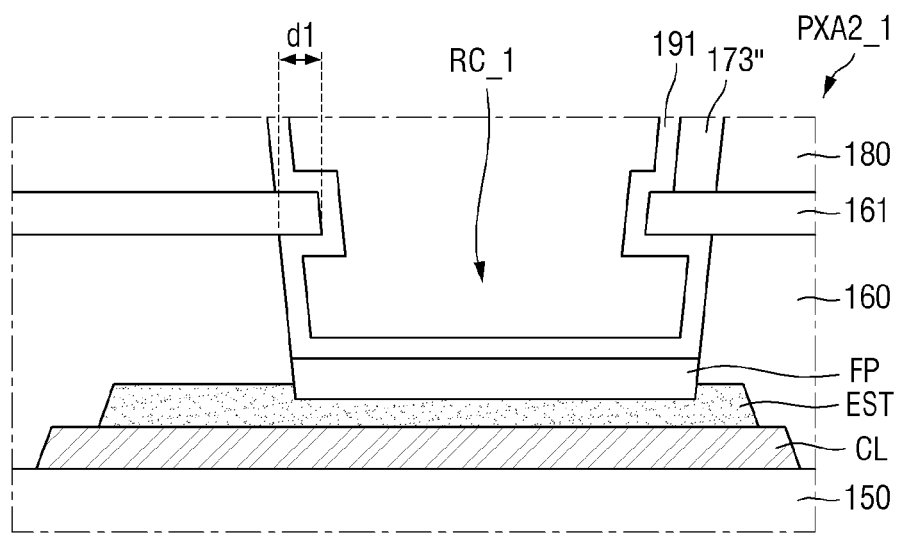
FIG. 14 is a cross-sectional view of an embodiment of a second pixel area of a display panel.

FIG. 14 is a cross-sectional view of an embodiment of a second pixel area PXA2_1 of a display panel 100.

Referring to FIG. 14, a second pixel area PXA2_1 is different from the embodiment of FIG. 9 in that the side wall of a recess pattern RC_1 of the second pixel area PXA2_1 further includes a sidewall of an etch prevention pattern EST. In the process of providing or forming the recess pattern RC_1, a part of the upper portion of the etch prevention pattern EST may be etched away, and thus, the inner wall of the recess pattern RC_1 may be defined by sidewalls of the barrier layer 161, the second planarization layer 160, and the etch prevention pattern EST, as well as a horizontal surface of the etch prevention pattern EST. In this case, the side surface of the second planarization layer 160 providing or forming the inner wall of the recess pattern RC_1 and the side surface of the etch prevention pattern EST may be aligned (e.g., coplanar with each other), but the invention is not limited thereto.

Even in this case, the light emitting layer 172" (refer to FIG. 8) and the dummy light emitting layer FP of the second pixel PX2 (refer to FIG. 8) of the second pixel area PXA2_1 may be separated and spaced apart from each other, and it is possible to suppress or prevent external air and moisture from penetrating into the light emitting layer 172". Moreover, as a part of the upper portion of the etch prevention pattern EST is etched, the interval between the light emitting layer 172" (refer to FIG. 8) and the dummy light emitting layer FP along the third direction DR3 may increase, and thus the light emitting layer 172" (refer to FIG. 8) and the dummy light emitting layer FP may be easily separated and spaced apart from each other.

Figure 15:
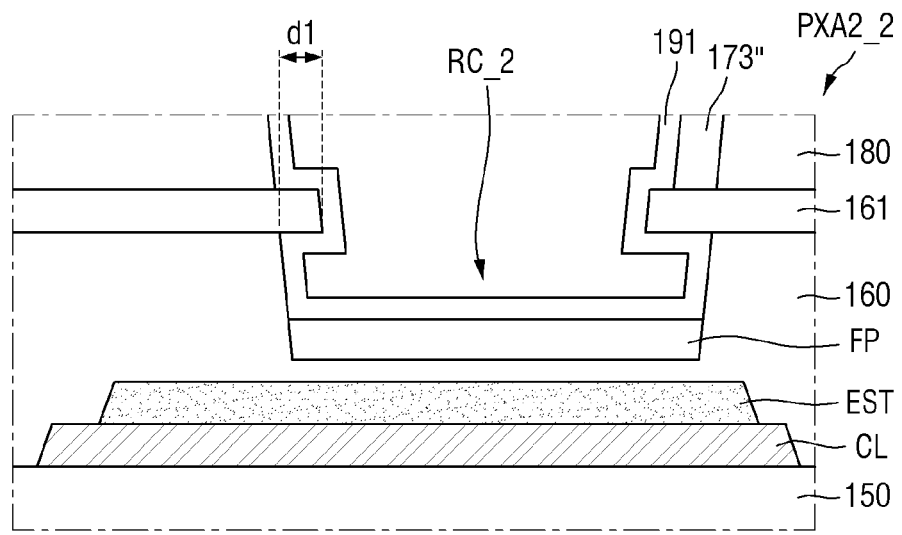
FIG. 15 is a cross-sectional view of an embodiment of a second pixel area of a display panel.

FIG. 15 is a cross-sectional view of an embodiment of a second pixel area PXA2_2 of a display panel 100.

Referring to FIG. 15, a second pixel area PXA2_2 is different from the embodiment of FIG. 9 in that a horizontal portion of a second planarization layer 160 is disposed between the dummy light emitting layer FP and etch prevention pattern EST of the second pixel area PXA2_2 along the third direction DR3. In the process of providing or forming a recess pattern RC_2, as the etch prevention pattern EST and the conductive line CL are covered with the barrier layer 161, a part of the second planarization layer 160 may remain without being etched in an area where the recess pattern RC_2 is provided or formed. Thereafter, the dummy light emitting layer FP may be disposed in the recess pattern RC_2, and the horizontal portion of the second planarization layer 160 may be disposed between the dummy light emitting layer FP and the etch prevention pattern EST. In this case, the bottom of the recess pattern RC_2 may be defined by a horizontal surface of the second planarization layer 160.

Even in this case, the light emitting layer 172" (refer to FIG. 8) and the dummy light emitting layer FP of the second pixel PX2 (refer to FIG. 8) of the second pixel area PXA2_2 may be separated and spaced apart from each other along the third direction DR3, and it is possible to suppress or prevent external air and moisture from penetrating into the light emitting layer 172". Moreover, as the second planarization layer 160 as well as the etch prevention pattern EST and the dummy light emitting layer FP are further disposed on the conductive line CL, the common electrode 173" (refer to FIG. 8) and the conductive line CL may be more easily insulated from each other.

Figure 16:
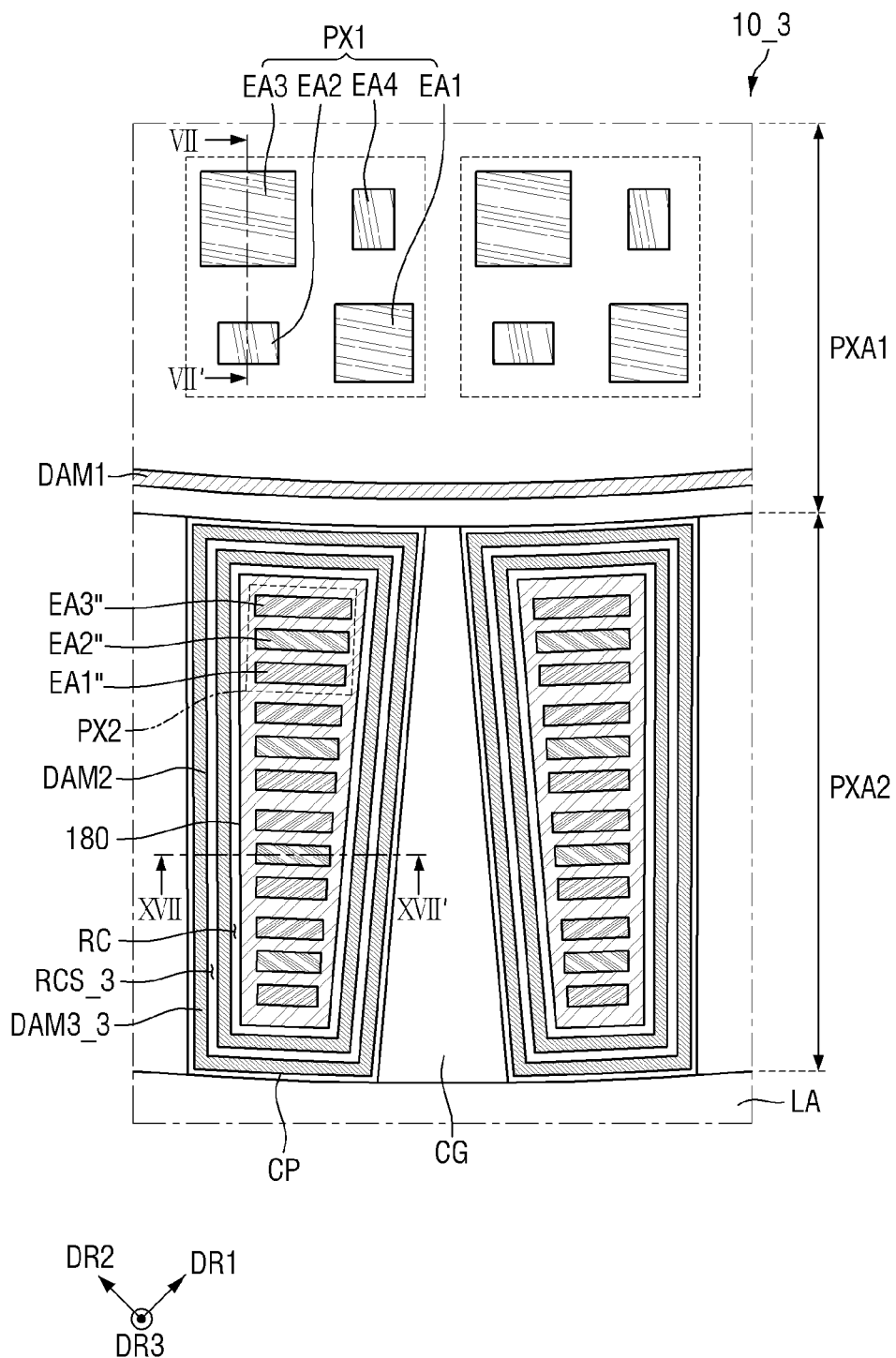
FIG. 16 is an enlarged view of an embodiment of a display device.
Figure 17:
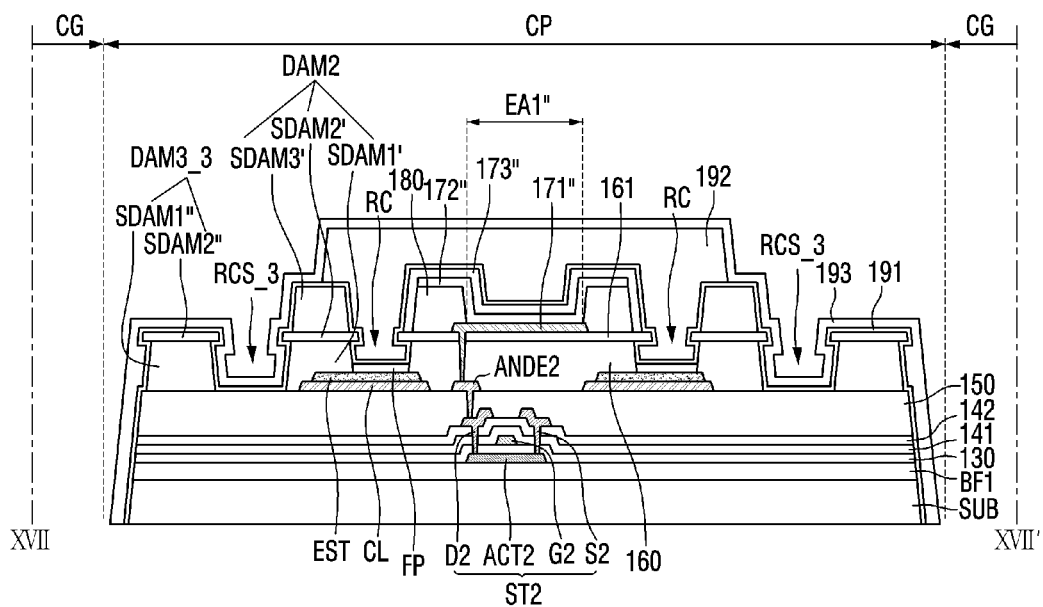
FIG. 17 is a cross-sectional view taken along line XVII-XVII' of FIG. 16.

FIG. 16 is an enlarged view of an embodiment of a display device 10_3. FIG. 17 is a cross-sectional view taken along line XVII-XVII' of FIG. 16. FIG. 16 illustrates a part of a plan view of a display device 10_3.

Referring to FIGS. 16 and 17, a display device 10_3 is different from the display device 10 of the embodiment of FIG. 6 in that the display device 10_3 further includes a third dam DAM3-3 and a sub-recess pattern RCS_3.

Specifically, the display device 10_3 may further include a third dam DAM3_3. The third dam DAM3_3 may be disposed in the second pixel area PXA2, and may be disposed within the protrusion pattern CP. The third dam DAM3_3 may be disposed outside the second dam DAM2 (e.g., from respective light emission areas than the second dam DAM2), and the third dam DAM3_3 may surround the second dam DAM2 in a plan view.

The third dam DAM3_3 may be disposed on the first planarization layer 150. The third dam DAM3_3 may include a first sub-dam SDAM1" including or formed of the same material as the second planarization layer 160 and a second sub-dam SDAM2" formed of the same material as the barrier layer 161. The first sub-dam SDAM1" and the second sub-dam SDAM2" may be sequentially stacked in order from the first planarization layer 150. However, the invention is not limited thereto, and the third dam DAM3_3 may further include a third sub-dam (not shown) including or formed of the same material as the pixel defining layer 180.

The sub-recess pattern RCS_3 may be disposed between the second dam DAM2 and the third dam DAM3_3. The sub-recess pattern RCS_3 may penetrate the barrier layer 161 and the second planarization layer 160 along the thickness direction. The sub-recess pattern RCS_3 may be defined by sidewalls of the barrier layer 161 and the second planarization layer 160. The sub-recess pattern RCS_3 may have an under-cut shape.

The encapsulation organic layer 192 and the dummy light emitting layer FP may not be disposed in the sub-recess pattern RCS_3. However, the invention is not limited thereto, and the encapsulation organic layer 192 and the dummy light emitting layer FP may be disposed in the sub-recess pattern RCS_3. Moreover, although not shown, an etch prevention pattern EST may be further disposed in an area in which the sub-recess pattern RCS_3 is disposed. In other words, a bottom of the sub-recess pattern RCS_3 may be defined by a surface of the etch prevention pattern EST. In this case, the conductive line CL may also be disposed in an area overlapping the sub-recess pattern RCS_3.

Even in this case, the light emitting layer 172" and the dummy light emitting layer FP of the second pixel PX2 of the second pixel area PXA2 may be separated and spaced apart from each other, and it is possible to suppress or prevent external air and moisture from penetrating into the light emitting layer 172". Moreover, as the third dam DAM3_3 is further disposed outside the second dam DAM2, the light emitting layer 172" and the dummy light emitting layer FP may be easily separated and spaced apart from each other in a direction along the first planarization layer 150, and it is possible to more easily suppress or prevent the encapsulation organic layer 192 from overflowing to outside the protrusion pattern CP, so that reliability of the display device 10_3 may be improved.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device, comprising:
   a front portion, a first side portion extending from a first side of the front portion, a second side portion extending from a second side of the front portion, and a corner portion disposed between the first side portion and the second side portion; and
   a display panel including:
      a plurality of protrusion patterns which are in the corner portion and connected to each other along a boundary between the corner portion and each of the front portion, the first side portion and the second side portion, respectively,
      a cutout portion which completely separates the plurality of protrusion patterns from each other from the boundary to respective ends of the plurality of protrusion patterns, and
      each of the protrusion patterns including:
         a plurality of pixels, and
         a recess which surrounds the plurality of pixels.

2. The display device of claim 1, wherein each of the plurality of protrusion patterns further includes:
   a planarization layer,
   the pixels including a light emitting element on the planarization layer, and
   the planarization layer defining the recess which surrounds the light emitting element.

3. The display device of claim 2, wherein each of the plurality of protrusion patterns further includes:
   a barrier layer between the planarization layer and the light emitting element,
   the recess extending through the barrier layer and into the planarization layer, and
   the recess defined by a side surface of the planarization layer and a side surface of the barrier layer.

4. The display device of claim 3, wherein within the recess, the barrier layer extends further than the side surface of the planarization layer.

5. The display device of claim 2, wherein each of the plurality of protrusion patterns further includes:
   an etch prevention pattern which faces the planarization layer, and
   the recess which exposes the etch prevention pattern to outside the planarization layer.

6. The display device of claim 1, wherein each of the plurality of protrusion patterns further includes:
   the pixels including a light emitting layer;
   a planarization layer defining the recess which surrounds the light emitting layer, and
   a dummy light emitting layer in the recess,
   wherein the light emitting layer of the pixels and the dummy light emitting layer are separated and spaced apart from each other.

7. The display device of claim 6, wherein within each of the plurality of protrusion patterns, the dummy light emitting layer in the recess includes the same material as the light emitting layer of the pixels.

8. The display device of claim 1, wherein the display panel further includes a main portion and a bending portion which extends from a side surface of the main portion, and
   the protrusion pattern protrudes from at least one of the main portion and the bending portion.

9. The display device of claim 8, wherein
   the bending portion includes a first bending portion extending from a first side of the main portion, and a second bending portion extending from a second side of the main portion, and
   the plurality of protrusion patterns are disposed between the first bending portion and the second bending portion.

10. The display device of claim 1, wherein each of the plurality of protrusion patterns further includes:
    an inner sidewall defining the recess,
    an outer sidewall defining an outer side surface of each of the plurality of protrusion patterns,
    a planarization layer defining the recess which surrounds the pixels, a thin film encapsulation layer on the pixels and including both an inorganic layer and an organic layer, and the inorganic layer of the thin film encapsulation layer extending from the pixels, along the inner sidewall which defines the recess and along the outer sidewall which defines the outer side surface of each of the plurality of protrusion patterns.

11. The display device of claim 1, wherein the first side portion has a round shape of a first curvature, the second side portion has a round shape of a second curvature, and the corner portion has a double curvature bent by the first curvature and the second curvature.

12. A display device, comprising:

a display panel including a main portion, a bent portion extending from the main portion, and a plurality of protrusion patterns each extending in a direction away from the main portion from at least one of the main portion and the bent portion and partially disconnected from each other to be bendable relative to the main portion or the bent portion, respectively, a cutout portion which completely separates the plurality of protrusion patterns from each other from a boundary between the plurality of protrusion patterns and the at least one of the main portion and the bent portion, respectively, to respective ends of the plurality of protrusion patterns;

wherein each of the plurality of protrusion patterns includes:

a light emitting element of a display pixel, the light emitting element including an electrode and a light emitting layer which faces the electrode;

a pixel defining layer which exposes the electrode of the light emitting element to outside the pixel defining layer;

a planarization layer and a barrier layer in order toward the pixel defining layer;

the planarization layer defining a recess which surrounds the light emitting element; and at the recess, a conductive line and an etch prevention pattern in order toward the pixel defining layer.

13. The display device of claim 12, wherein within each of the plurality of protrusion patterns, the recess exposes the etch prevention pattern to outside the planarization layer.

14. The display device of claim 13, wherein each of the plurality of protrusion patterns further includes:

the recess extending through the barrier layer and into the planarization layer, and the recess defined by a side surface of the planarization layer and a side surface of the barrier layer.

15. The display device of claim 14, wherein each of the plurality of protrusion patterns further includes:

the recess extending through the planarization layer and into the etch prevention pattern, and the recess further defined by a side surface of the etch prevention pattern.

16. The display device of claim 12, wherein each of the plurality of protrusion patterns further includes a dummy light emitting layer which is in the recess and separated from the light emitting layer of the light emitting element.

17. The display device of claim 16, wherein at the recess each of the plurality of protrusion patterns further includes in order toward the pixel defining layer, the planarization layer, the conductive line, the etch prevention pattern and the dummy light emitting layer.

18. A method of providing a display device, the method comprising:

providing a display panel including a main portion and a bent side portion which extends from the main portion and includes a light emitting element of a display pixel, providing at the bent side portion of the display panel:

a substrate, a conductive line, an etch prevention pattern, an organic layer and an inorganic layer in order, a first area corresponding to the conductive line and the etch prevention pattern, and a second area adjacent to the first area and excluding the conductive line and the etch prevention pattern; and in a same process, both:

in the first area, providing a recess which is in the inorganic layer and the organic layer and surrounds the light emitting element of the display pixel, and in the second area, providing a cutout portion which is extended through each of the inorganic layer, the organic layer and the substrate and open to outside the display panel at both of the substrate and the inorganic layer, to completely separate portions of the first area from each other from a boundary between the main portion and the bent side portion, to respective ends of the portions of the first area.

19. The method of claim 18, wherein both the recess and the cutout portion are provided by dry etching.

20. The method of claim 18, wherein the providing of the recess includes exposing the etch prevention pattern to outside the inorganic layer and the organic layer.

* * * * *